US011621320B2

(12) United States Patent
Hoshi

(10) Patent No.: US 11,621,320 B2
(45) Date of Patent: Apr. 4, 2023

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/389,024

(22) Filed: Jul. 29, 2021

(65) Prior Publication Data

US 2022/0069072 A1   Mar. 3, 2022

(30) Foreign Application Priority Data

Sep. 3, 2020   (JP) .............................. JP2020-147932

(51) Int. Cl.
*H01L 29/06* (2006.01)
*H01L 29/78* (2006.01)

(52) U.S. Cl.
CPC ...... *H01L 29/0626* (2013.01); *H01L 29/7806* (2013.01)

(58) Field of Classification Search
CPC ............. H01L 29/0626; H01L 29/7806; H01L 29/1608; H01L 29/872; H01L 29/0619; H01L 29/0623; H01L 29/0696; H01L 29/0878; H01L 29/1095; H01L 29/66068; H01L 29/66734; H01L 29/7804; H01L 29/7805; H01L 29/7815; H01L 29/7813; H01L 29/66325–66348; H01L 29/7393–7398; H01L 29/083–0839; H01L 29/66613–66628; H01L 29/7825
See application file for complete search history.

(56) References Cited

U.S. PATENT DOCUMENTS

| 2016/0079411 A1 | 3/2016 | Hino et al. |
| 2018/0138274 A1* | 5/2018 | Ohse ................. H01L 29/66333 |
| 2018/0182885 A1 | 6/2018 | Kobayashi |
| 2018/0233564 A1 | 8/2018 | Kumada et al. |

(Continued)

FOREIGN PATENT DOCUMENTS

| JP | 2018-107168 A | 7/2018 |
| JP | 2018-133377 A | 8/2018 |
| WO | 2014/162969 A1 | 10/2014 |

*Primary Examiner* — Shahed Ahmed
(74) *Attorney, Agent, or Firm* — Rabin & Berdo, P.C.

(57) ABSTRACT

A main semiconductor device element is SiC-MOSFETs with a trench gate structure, the main semiconductor device element having main MOS regions responsible for driving the MOSFETs and main SBD regions that are regions responsible for SBD operation. The main MOS regions and the main SBD regions are adjacent to one another and each pair of a main MOS region and a main SBD region adjacent thereto share one trench. In the main SBD regions, first and second p-type regions, and Schottky electrodes at the front surface of the semiconductor substrate and forming Schottky junctions with an n$^-$-type drift region are provided. The first p-type regions are provided along sidewalls of the trenches, in contact with the first p$^+$-type regions at the bottoms of the trenches. The second p-type regions are provided between the first p-type regions and the Schottky electrodes, and are electrically connected to these regions.

9 Claims, 19 Drawing Sheets

(56) References Cited

U.S. PATENT DOCUMENTS

| | | | |
|---|---|---|---|
| 2018/0358444 A1* | 12/2018 | Ryo | H01L 29/66068 |
| 2020/0091299 A1* | 3/2020 | Nakamata | H01L 29/45 |
| 2020/0303507 A1* | 9/2020 | Yilmaz | H01L 29/66348 |
| 2021/0098620 A1* | 4/2021 | Tominaga | H01L 29/7805 |

* cited by examiner

SEMICONDUCTOR DEVICE

CROSS REFERENCE TO RELATED APPLICATIONS

This application is based upon and claims the benefit of priority of the prior Japanese Patent Application No. 2020-147932, filed on Sep. 3, 2020, the entire contents of which are incorporated herein by reference.

BACKGROUND OF THE INVENTION

1. Field of the Invention

Embodiments of the invention relate to a semiconductor device.

2. Description of the Related Art

Among power semiconductor devices that control high voltage and/or large current, there are several types such as bipolar transistors, insulated gate bipolar transistors (IGBTs), and metal oxide semiconductor field effect transistors (MOSFETs) that have insulated gates (MOS gates) having a 3-layer structure including a metal, an oxide film, and a semiconductor; these devices are selectively used according to an intended purpose.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, MOSFETs have low current density compared to bipolar transistors and IGBTs and are difficult to adapt for large current but can be switched at high speeds up to about several MHz.

Further, a MOSFET, unlike an IGBT, has a built-in parasitic diode formed by pn junctions between an n$^-$-type drift region and p-type base regions in a semiconductor substrate (semiconductor chip). Therefore, in an instance in which a MOSFET is used as a device for an inverter, this parasitic diode may be used to function as a diode (freewheeling diode (FWD)) for commutating load current flowing therethrough and a freewheeling diode for protecting itself.

While silicon (Si) is used as material for fabricating power semiconductor devices, there is a strong demand in the market for large-current, high-speed power semiconductor devices and thus, IGBTs and power MOSFETs have been intensively developed and improved, and the performance of power devices has substantially reached theoretical limit determined by the material. Therefore, in terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is at least ten times that of silicon and therefore, is expected to be a semiconductor material capable of sufficiently reducing ON resistance. Such characteristics of silicon carbide are also applicable to other semiconductors having a bandgap wider than a bandgap of silicon (hereinafter, wide bandgap semiconductors).

In a semiconductor substrate that uses a wide bandgap semiconductor as a semiconductor material, similarly to a semiconductor substrate that uses silicon as a semiconductor material, a Schottky barrier diode (SBD) having rectification characteristics due to a Schottky junction between the semiconductor substrate and a conduction layer of, for example, metal deposited on the semiconductor substrate may be fabricated. Therefore, an SBD that uses a wide bandgap semiconductor as a material of the semiconductor substrate and that has a high breakdown voltage and a low ON resistance may be realized.

Further, in a MOS-type semiconductor device such as an IGBT or MOSFET, configuration of a trench gate structure in which, accompanying large current of a power semiconductor device, a channel (inversion layer) is formed along a sidewall of a trench, in a direction orthogonal to a front surface of a semiconductor chip is advantageous in terms of cost as compared to a planar gate structure in which the channel is formed along the front surface of the semiconductor chip. A reason for this is that unit cell (configuration unit of a device element) density per unit area may be increased with a trench gate structure and therefore, current density per unit area may be increased.

A rate of temperature rise relative to a volume occupied by the unit cells increases by an extent to which device current density is increased and therefore, to enhance discharge efficiency and stabilize reliability, a double-sided cooling structure is necessary. Further, a power semiconductor device that enhances reliability by having a high-function structure in which, on a single semiconductor substrate having a main semiconductor device element that is the MOSFET and performs a main operation of the power semiconductor device, high-function portions such as a current sensing portion, a temperature sensing portion, and an over-voltage protecting portion are disposed as circuit portions for protecting and controlling the main semiconductor device element.

A structure of a conventional semiconductor device is described taking, as an example, a SiC-MOSFET having silicon carbide as a semiconductor material. FIG. 26 is a cross-sectional view of a structure of the conventional semiconductor device. A conventional semiconductor device 220 depicted in FIG. 26 is a vertical MOSFET having a trench gate structure and is configured by multiple unit cells provided in a semiconductor substrate (semiconductor chip) 210 containing silicon carbide, the unit cells being provided adjacent to one another in a direction (in FIG. 26, a second direction Y) parallel to a front surface of the semiconductor substrate 210. In the semiconductor substrate 210, an n$^-$-type epitaxial layer 272 constituting an n$^-$-type drift region 232, and a p-type epitaxial layer 273 constituting a p-type base region 234 are sequentially formed by epitaxial growth on a front surface of an n$^+$-type starting substrate 271 containing silicon carbide.

A main surface of the semiconductor substrate 210 having the p-type epitaxial layer 273 is assumed as a front surface while another main surface of the semiconductor substrate 210 having the n$^+$-type starting substrate 271 is assumed as a back surface. In the semiconductor substrate 210, at the front surface thereof, a MOS gate having a trench gate structure configured by the p-type base region 234, an n$^+$-type source region 235, a p$^{++}$-type contact region 236, a trench 237, a gate insulating film 238, and a gate electrode 239 is provided for each unit cell. Between the trenches 237 that are adjacent to one another, the n$^+$-type source regions 235 and the p$^{++}$-type contact regions 236 each selectively provided in the p-type epitaxial layer 273 are exposed in contact holes 240a of an interlayer insulating film 240 and are in ohmic contact with a metal silicide film 241.

The metal silicide film 241, a barrier metal 246, and a source pad 221 sequentially stacked on the front surface of the semiconductor substrate 210 function as a source electrode. A double-sided cooling structure is configured by a wiring structure on the source pad 221 and a cooling fin (not depicted) bonded to a drain electrode 251 on the back surface of the semiconductor substrate 210. Reference numerals 231 and 233 are an $n^+$-type drain region and n-type current spreading regions. Reference numerals 261 and 262 are $p^+$-type regions that mitigate electric field applied to bottoms of the trenches 237. Reference numerals 242, 243, 244, and 245 are metal films configuring the barrier metal 246. Reference numerals 247, 248, 249, and 250 are parts configuring the wiring structure on the source pad 221.

In the semiconductor substrate 210, parasitic diodes are formed by pn junctions between the $p^{++}$-type contact regions 236, the p-type base region 234, the $p^+$-type regions 261, 262, the n-type current spreading regions 233, the $n^-$-type drift region 232, and the $n^+$-type drain region 231. When forward current is applied to the parasitic diodes built into the semiconductor substrate 210 containing silicon carbide, with basal dislocations of the $n^+$-type starting substrate 271 as points of origin, stacking faults (not depicted) in the $n^-$-type epitaxial layer 272 grow, and forward characteristics of the parasitic diodes degrade over time as the conduction time increases, whereby reliability becomes poor. Therefore, forward characteristics of the parasitic diodes of the MOSFET is inspected by a predetermined screening test.

Further, a semiconductor device has been proposed in which an SBD (not depicted) that is a majority carrier device (unipolar device) that does not use minority carriers for conduction is built into the semiconductor substrate 210 having the MOSFET, and by a flow of forward current in the SBD when the MOSFET is OFF, forward current does not flow through the parasitic diodes of the MOSFET. Further, even in an instance of a structure in which a MOSFET constituting a main semiconductor device element has a built-in SBD and a MOSFET constituting a current sensing portion for protecting and controlling the main semiconductor device element also has a built-in SBD, adverse effects occur due to positive hole current flowing around in from the main semiconductor device element and a peripheral region of the current sensing portion in which multiple electrode pads are disposed.

As a conventional SiC-MOSFET having a built-in SBD, a device has been proposed in which between a p-type base region of a main MOSFET of an active region and a p-type base region of a current sensing portion of a periphery of the active region, a p-type well region of a source potential of the current sensing portion and the main MOSFET is provided separate from the p-type base regions, and a Schottky electrode is in contact with an n-type region disposed in such a way that a portion of the p-type well region is missing (for example, refer to International Publication No. WO 2014/162969). In International Publication No. WO 2014/162969, in a reflux state by a Schottky electrode positioned in a periphery of the active region, voltage drops occur, the voltage applied to the SBD built into the main MOSFET is mitigated, and parasitic diode operation is suppressed, whereby, a majority of the positive current is refluxed by the SBD.

As another conventional SiC-MOSFET having a built-in SBD, a device has been proposed in which, between different trenches that are adjacent to one another, a region responsible for driving a MOSFET and a region responsible for SBD operation are provided, and an n-type region formed by inverting a p-type epitaxial layer into an n-type, a Schottky electrode in contact with the n-type region, and a p-type base region configured by the remaining p-type epitaxial layer between the n-type region and sidewalls of the trenches are included in the region responsible for SBD operation (for example, refer to Japanese Laid-Open Patent Publication No. 2018-107168). In Japanese Laid-Open Patent Publication No. 2018-107168, when the MOSFET is OFF, by passing current in the SBD connected in parallel to a parasitic pn diode before current flows in the parasitic pn diode, degradation over time due to parasitic diode operation is suppressed.

As a conventional SiC-MOSFET, a device has been proposed in which, closer to a drain than are trenches, multiple $p^+$-type regions that mitigate electric field applied to bottoms of the trenches are provided; and between the trenches that are adjacent to one another, lifetime killer regions are provided at positions not facing $p^+$-type contact regions in a depth direction so as to connect the $p^+$-type regions facing the trench bottoms and the $p^+$-type regions adjacent to a p-type base region in the depth direction (for example, refer to Japanese Laid-Open Patent Publication No. 2018-133377). In Japanese Laid-Open Patent Publication No. 2018-133377, generation of crystalline defects is suppressed in an instance in which minority carriers are reduced by the lifetime killer regions, whereby current passing near gate electrodes and through parasitic diodes is reduced, high potential is applied to a source electrode, and the parasitic diodes are driven.

SUMMARY OF THE INVENTION

According to an embodiment of the invention, a semiconductor device includes a semiconductor substrate containing a semiconductor having a bandgap wider than a bandgap of silicon, the semiconductor substrate having a first main surface and a second main surface opposite to each other; a first semiconductor region of a first conductivity type, provided in the semiconductor substrate, at the first main surface of the semiconductor substrate; a plurality of second semiconductor regions of a second conductivity type, selectively provided between the first main surface of the semiconductor substrate and the first semiconductor region; a plurality of third semiconductor regions of the first conductivity type, selectively provided between the first main surface of the semiconductor substrate and the second semiconductor regions, the third semiconductor regions having an impurity concentration higher than an impurity concentration of the first semiconductor region; a plurality of trenches penetrating through the third semiconductor regions and the second semiconductor regions, and reaching the first semiconductor region; a plurality of gate electrodes that are respectively provided in the trenches via a respective one of a plurality of gate insulating films; a plurality of first high-concentration regions of the second conductivity type, selectively provided in the first semiconductor region, the first high-concentration regions, in a depth direction, respectively facing and surrounding bottoms of the trenches, the first high-concentration regions having an impurity concentration higher than an impurity concentration of the second semiconductor regions; a plurality of second high-concentration regions of the second conductivity type, selectively provided in the first semiconductor region, separate from the first high-concentration regions and the trenches, and in contact with the second semiconductor regions, the second high-concentration regions reaching positions deeper from the second semiconductor regions than are positions of the bottoms of the trenches, the second high-concentration regions having an impurity concentration higher than the impurity concentration of the second semiconductor regions; a first electrode provided on the first main surface of the semiconductor substrate, in ohmic contact with the second semiconductor regions and the third semiconductor regions; a plurality of first Schottky electrodes provided on the first main surface of the semiconductor substrate, the first Schottky electrodes electrically connected to the first electrode and forming Schottky junctions with the first semiconductor region; and a second electrode provided on the second main surface of the semiconductor substrate. The first Schottky electrodes are respectively provided in regions respectively between the trenches, and in each of the regions: a respective one of a plurality of fourth semiconductor regions of the second conductivity type is provided between a sidewall of a respective one of the trenches and the first semiconductor region, the respective one of the fourth semiconductor regions extending in the depth direction along the sidewall of the respective one of the trenches, from the first main surface of the semiconductor substrate, the respective one of the fourth semiconductor regions being in contact with a respective one of the first high-concentration regions, and a respective one of a plurality of fifth semiconductor regions of the second conductivity type is provided between the respective one of the fourth semiconductor regions and the first semiconductor region, in contact with the respective one of the fourth semiconductor regions, the first semiconductor region, and a respective one of the first Schottky electrodes.

Objects, features, and advantages of the present invention are specifically set forth in or will become apparent from the following detailed description of the invention when read in conjunction with the accompanying drawings.

DETAILED DESCRIPTION OF THE INVENTION

Figure 26:
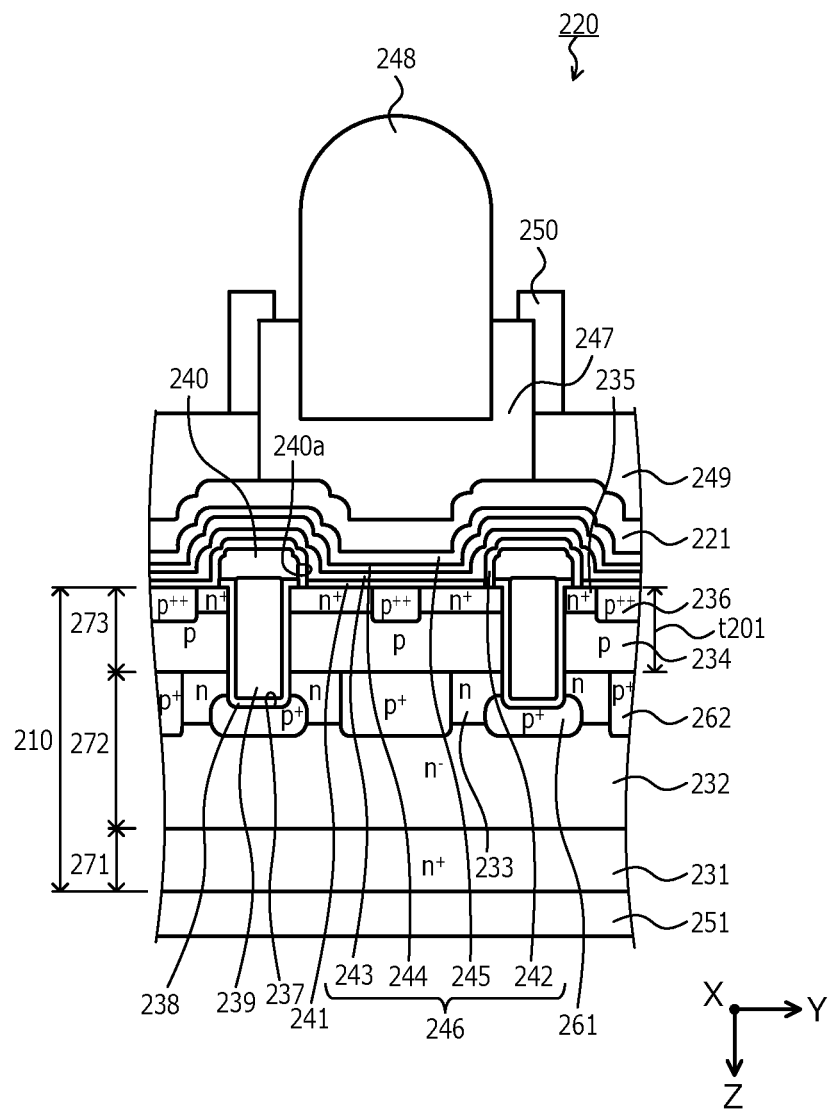
FIG. 26 is a cross-sectional view of a structure of a conventional semiconductor device.

First, problems associated with the conventional techniques are discussed. In the conventional semiconductor device 220 (refer to FIG. 26), when the device element structure has a built-in (integrated) SBD, electric field concentrates in the SBD when the MOSFET is OFF and destruction easily occurs at a portion of the SBD.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
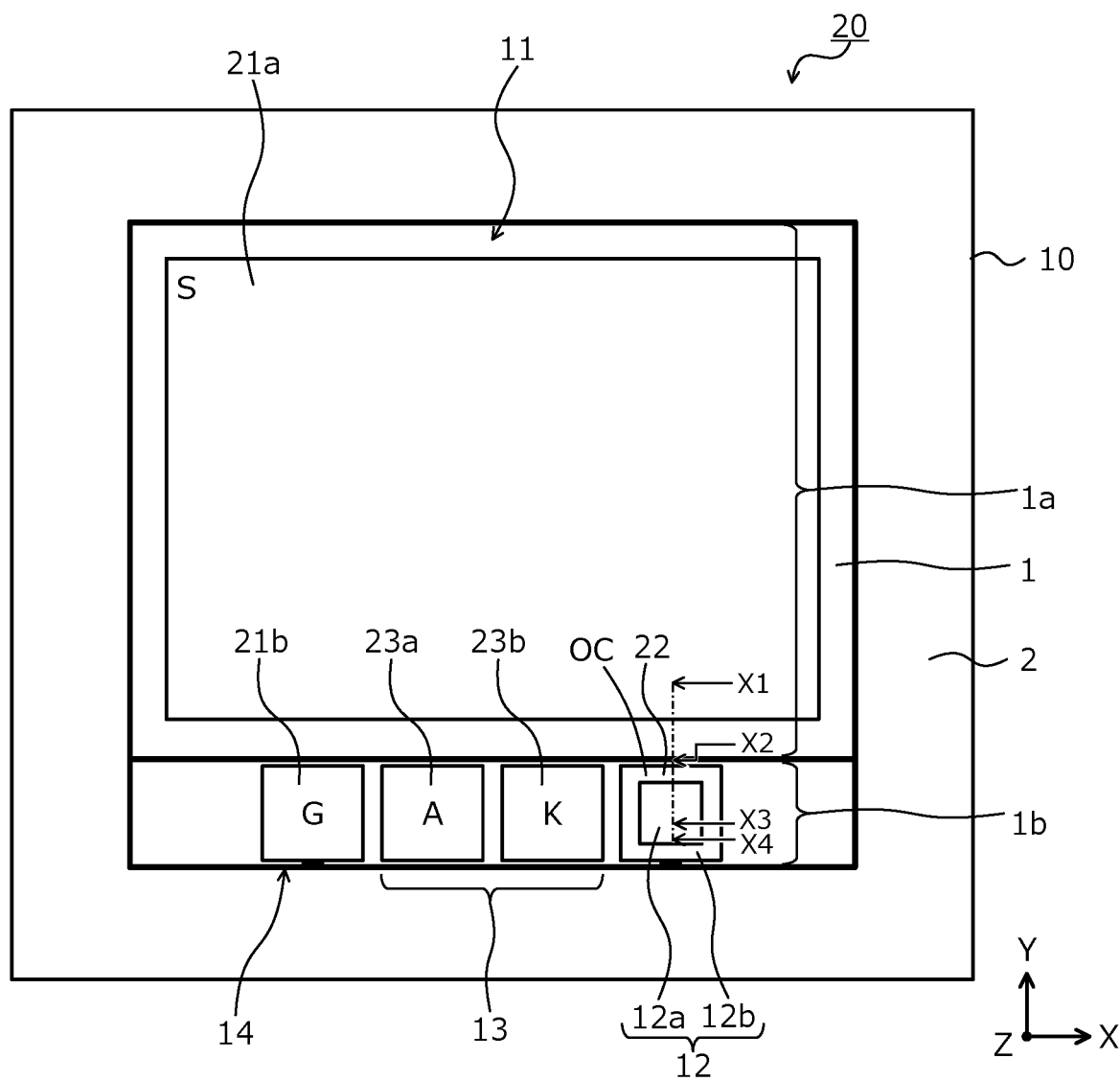
FIG. 1 is a plan view of a layout when a semiconductor device according to a first embodiment is viewed from a front side of a semiconductor substrate.
Figure 2:
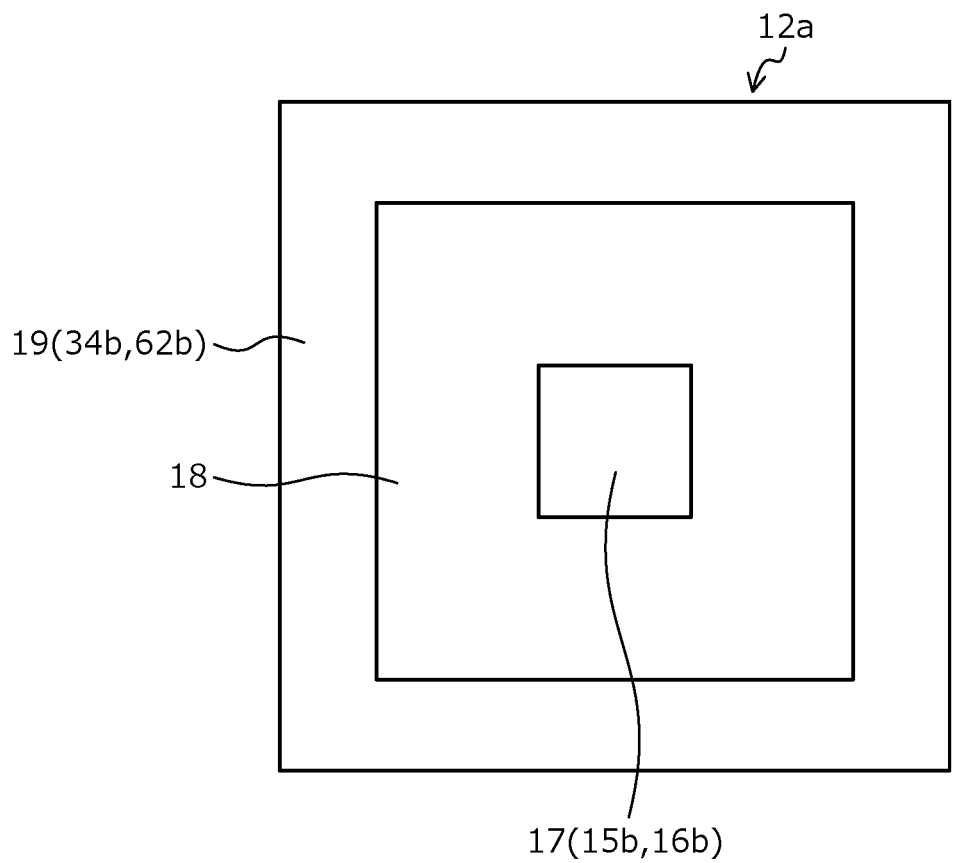
FIG. 2 is an enlarged view of a sensing effective region in FIG. 1.

A semiconductor device according to a first embodiment is configured using, as a semiconductor material, a semiconductor (wide bandgap semiconductor) having a bandgap wider than a bandgap of silicon (Si). Here, an instance in which silicon carbide (SiC), which is a wide bandgap semiconductor, is used as a semiconductor material is taken as an example in describing a structure of the semiconductor device according to the first embodiment. FIG. 1 is a plan view of a layout when the semiconductor device according to the first embodiment is viewed from a front side of a semiconductor substrate. FIG. 2 is an enlarged view of a sensing effective region in FIG. 1.

A semiconductor device 20 according to the first embodiment depicted in FIG. 1 has, in an active region 1 of a single semiconductor substrate (semiconductor chip) 10 containing silicon carbide, a main semiconductor device element 11 and at least one circuit portion for protecting and controlling the main semiconductor device element 11. The active region 1 is provided in substantially a center (chip center) of the semiconductor substrate 10. The main semiconductor device element 11 are vertical MOSFETs having built-in SBDs, the main semiconductor device element 11 being configured by multiple unit cells (functional units of a device element) connected in parallel to one another by a later-described source pad 21a, and performing a main operation of the semiconductor device 20.

The main semiconductor device element 11 is disposed in an effective region (hereinafter, main effective region) 1a of the active region 1. The main effective region 1a is a region in which a main current (drift current) of the main semiconductor device element 11 flows in a direction from a back surface of the semiconductor substrate 10 to a front surface thereof (direction opposite to a depth direction Z), when the main semiconductor device element 11 is ON. The main effective region 1a has, for example, a substantially rectangular shape in a plan view thereof and occupies a majority of a surface area of the active region 1. For example, three sides of the main effective region 1a having a substantially rectangular shape in a plan view thereof are adjacent to a later-described edge termination region 2.

In the main effective region 1a, regions responsible for driving the MOSFETs of the main semiconductor device element 11 (hereinafter, main MOS regions (first device element regions)) 15a and regions responsible for operation of the SBDs (hereinafter, main SBD regions (second device element regions)) 16a are provided (refer to FIG. 4). The main SBD regions 16a suppress operation of parasitic diodes (body diodes) formed in the MOSFETs disposed in the main MOS regions 15a. One unit cell of the main semiconductor device element 11 is configured by a set including one of the main MOS regions 15a and one of the main SBD regions 16a adjacent to each another.

Figure 4:
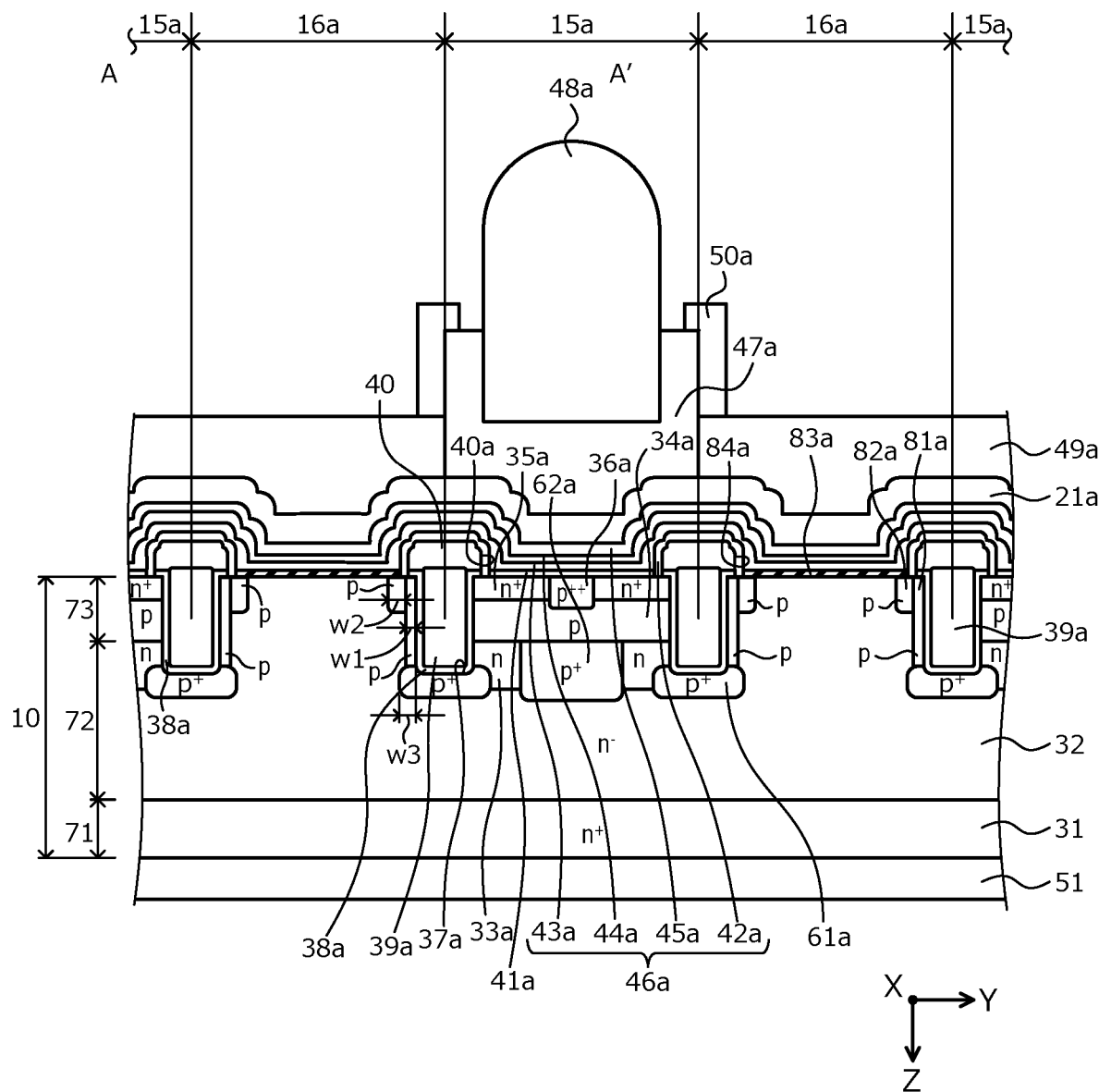
FIG. 4 is a cross-sectional view of the structure of the active region in FIG. 1.

In each of the sets, the main MOS region 15a and the main SBD region 16a adjacent to each another share one of multiple trenches 37a (refer to FIG. 4). The adjacent two of the trenches 37a located at both sides of the main MOS region 15a may also be referred to as a first adjacent two of the trenches, and the adjacent two of the trenches 37a located at both sides of the main SDB region 16a may also be referred to as a second adjacent two of the trenches. For example, the main MOS regions 15a and the main SBD regions 16a extend in linear shapes in a same direction as a direction (first direction X) which the trenches 37a extend parallel to the front surface of the semiconductor substrate 10 and are disposed repeatedly alternating one another in a direction (the second direction Y orthogonal to the first direction X and parallel to the front surface of the semiconductor substrate 10) in which the trenches 37a are adjacent to one another, whereby the unit cells of the main semiconductor device element 11 are disposed in parallel.

The circuit portions for protecting and controlling the main semiconductor device element 11 are, for example, high-function portions such as a current sensing portion 12, a temperature sensing portion 13, an overvoltage protecting portion (not depicted), and the arithmetic circuit portion (not depicted), and are disposed in a main non-operating region 1b of the active region 1. The main non-operating region 1b is a region free of the unit cells of the main semiconductor device element 11 and does not function as the main semiconductor device element 11. The main non-operating region 1b, for example, has a substantially rectangular shape in a plan view thereof and is disposed between the edge termination region 2 and a remaining side of the main effective region 1a, which has the substantially rectangular shape in a plan view thereof.

The edge termination region 2 is a region between the active region 1 and an end (chip end) of the semiconductor substrate 10, is adjacent to the active region 1, surrounds a periphery of the periphery of the active region 1, and has a function of mitigating electric field of the front side of the semiconductor substrate 10 and sustaining a breakdown voltage. In the edge termination region 2, for example, a general voltage withstanding structure (not depicted) such as a field limiting ring (FLR), a junction termination extension (JTE) structure, etc. is disposed. The breakdown voltage is a voltage limit at which no destruction or erroneous operation of the semiconductor device occurs.

The source pad (electrode pad) 21a of the main semiconductor device element 11 is disposed in the main effective region 1a, on the front surface of the semiconductor substrate 10. The source pad 21a of the main semiconductor device element 11 is disposed separate from electrode pads other than the source pad 21a. The main semiconductor device element 11 is large as compared to other circuit portions. Therefore, the source pad 21a of the main semiconductor device element 11 has substantially a same shape as that of the main effective region 1a in a plan view and covers substantially an entire area of the main effective region 1a.

The electrode pads other than the source pad 21a are provided in the main non-operating region 1b, on the front surface of the semiconductor substrate 10 separate from one another. The electrode pads other than the source pad 21a are a gate pad 21b of the main semiconductor device element 11, an electrode pad (OC pad) 22 of the current sensing portion 12, electrode pads (anode pad and the cathode pad) 23a, 23b of the temperature sensing portion 13, an electrode pad (hereinafter, OV pad, not depicted) of the overvoltage protecting portion, and an electrode pad (not depicted) of the arithmetic circuit portion.

The electrode pads other than the source pad 21a, for example, have a substantially rectangular shape in a plan view thereof and have a surface area necessary for bonding later-described the terminal pins (for example, refer to reference character 48b in FIG. 3) or a wire (not depicted). In FIG. 1, an instance is depicted in which the electrode pads other than the source pad 21a are disposed in a single row along a border between the main non-operating region 1b and the edge termination region 2, in the first direction X. In FIG. 1, the source pad 21a, the gate pad 21b, the OC pad 22, the anode pad 23a, and the cathode pad 23b are depicted as rectangular shapes indicated by "S", "G", "OG", "A", and "K", respectively.

The current sensing portion 12 is connected in parallel to the main semiconductor device element 11, operates under same conditions as those of the main semiconductor device element 11, and detects overcurrent (OC) flowing in the main semiconductor device element 11. The current sensing portion 12 is disposed separate from the main semiconductor device element 11. The current sensing portion 12 is a vertical MOSFET having a same configuration as that of the main semiconductor device element 11, including a built-in SBD, and the current sensing portion 12 has unit cells having a same configuration as those of the main semiconductor device element 11, the current sensing portion 12 having a fewer quantity (for example, about 10) of the unit cells than does the main semiconductor device element 11 (for example, at least about 1000).

Unit cells of the current sensing portion 12 are disposed in a first sensing region (current sensing region) 17 of a region (hereinafter, sensing effective region) 12a of a portion of a region of the semiconductor substrate 10, covered by the OC pad 22. The unit cells of the current sensing portion 12 are connected in parallel to one another by the OC pad 22. The first sensing region 17 of the sensing effective region 12a is a region through which a main current (drift current) of the current sensing portion 12 flows in the direction from the back surface of the semiconductor substrate 10 to the front surface thereof (direction opposite to the depth direction Z), when the current sensing portion 12 is ON.

The first sensing region 17 of the sensing effective region 12a, for example, has a substantially rectangular shape in a plan view thereof and is disposed in substantially a center of the sensing effective region 12a. In the first sensing region 17 of the sensing effective region 12a, regions (hereinafter, sensing MOS regions) 15b responsible for driving the MOSFETs of the current sensing portion 12 and regions (hereinafter, first sensing SBD regions) 16b responsible for SBD operation are provided (refer to FIG. 2). The first sensing SBD regions 16b suppress operation of parasitic diodes formed in MOSFETs disposed in the sensing MOS regions 15b.

One unit cell of the current sensing portion 12 is configured by a set including one of the sensing MOS regions 15b and one of the first sensing SBD regions 16b adjacent to each another. In each of the sets, the sensing MOS region 15b and the first sensing SBD region 16b adjacent to each other share one of multiple trenches 37b and extend in a linear shape in a same direction in which the trenches 37b extend (for example, the first direction X), the sensing MOS regions 15b and the first sensing SBD regions 16b being disposed repeatedly alternating one another in a direction (for example, the second direction Y) in which the trenches 37b are adjacent to one another (refer to FIG. 3). By such configuration, the unit cells of the current sensing portion 12 are disposed in plural.

Further, in the sensing effective region 12a, a second sensing region (first protective region, hereinafter, the second sensing SBD region) 18 responsible for SBD operation is provided so as to surround a periphery of the first sensing region 17 in substantially a rectangular shape. The second sensing SBD region 18 suppresses operation of parasitic diodes formed by pn junctions between an n⁻-type drift region (first semiconductor region) 32 and p-type regions (later-described p-type base regions 34a, 34b and second p⁺-type regions 62a, 62b, etc.) of the sensing non-operating region 12b and a later-described third sensing region 19. Further, the first sensing SBD regions 16b and the second sensing SBD region 18 protect the sensing MOS regions 15b from positive hole current. Either the first sensing SBD regions 16b or the second sensing SBD region 18 alone may be provided.

In addition to this, in the sensing effective region 12a, a third sensing region (second protective region) 19 is provided so as to surround a periphery of the second sensing SBD region 18 in a substantially rectangular shape. The third sensing region 19 is configured by p-type regions formed by the later-described p-type base regions (seventh semiconductor regions) 34b and the second p⁺-type regions 62b. Device element isolation (pn junction isolation) of the sensing effective region 12a and the later-described sensing non-operating region 12b from each other is by a pn junction between the p-type region (seventh semiconductor region) of the third sensing region 19 and the n⁻-type drift region. The p-type region of the third sensing region 19 is provided in a closed curve shape surrounding the periphery of the second sensing SBD region 18.

Of regions of the semiconductor substrate 10 covered by the OC pad 22, a region excluding the sensing effective region 12a is the sensing non-operating region 12b that does not function as the current sensing portion 12. The sensing non-operating region 12b surrounds a periphery of the sensing effective region 12a. The sensing non-operating region 12b is free of the unit cells of the current sensing portion 12. In substantially an entire area of a region of the main non-operating region 1b excluding the sensing effective region 12a, the later-described p-type base regions (second semiconductor regions) 34a (refer to FIGS. 3 and 4) of the main semiconductor device element 11 extend in surface regions of the semiconductor substrate 10, at the front surface of the semiconductor substrate 10.

The temperature sensing portion 13 has a function of detecting the temperature of the main semiconductor device element 11 (the semiconductor substrate 10), using diode temperature characteristics. The temperature sensing portion 13 is disposed directly beneath the anode pad 23a and the cathode pad 23b. The temperature sensing portion 13, for example, may be polysilicon diodes configured by a polysilicon (poly-Si) layer provided on an interlayer insulating film 40 of the front surface of the semiconductor substrate 10, or diffusion diodes formed by pn junctions between p-type regions and n-type regions formed in the semiconductor substrate 10.

The overvoltage protecting portion (not depicted), for example, is diodes that protect the main semiconductor device element 11 from overvoltage (OV) such as surges. The current sensing portion 12, the temperature sensing portion 13, and the overvoltage protecting portion are controlled by the arithmetic circuit portion. The arithmetic circuit portion controls the main semiconductor device element 11 based on output signals of the current sensing portion 12, the temperature sensing portion 13, and the overvoltage protecting portion. The arithmetic circuit portion is configured by multiple semiconductor device elements such as complementary MOS (CMOS) circuits.

Figure 3:
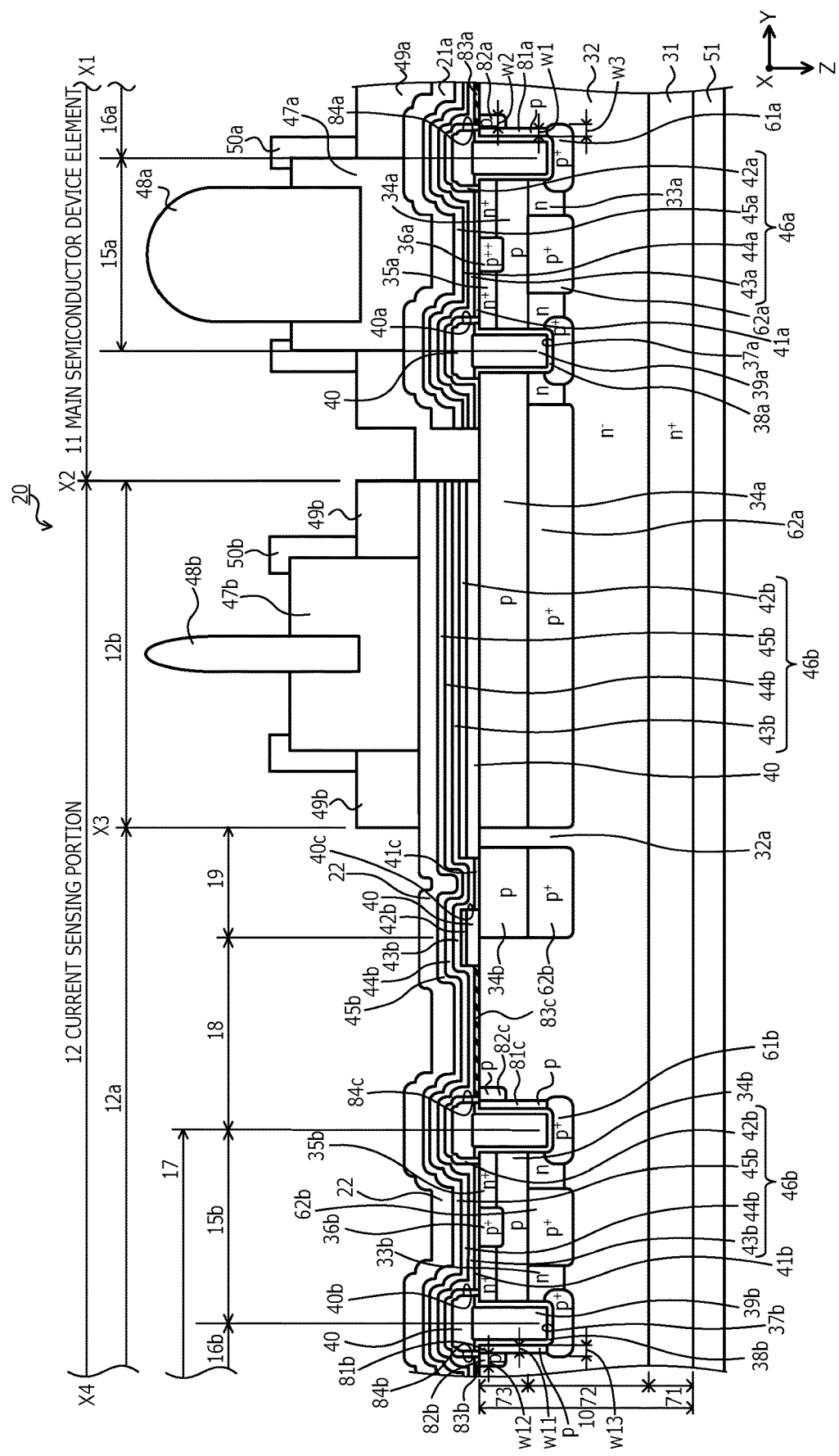
FIG. 3 is a cross-sectional view of a structure of an active region in FIG. 1.

Next, a cross-section of the structure of the semiconductor device 20 according to the first embodiment is described. FIGS. 3 and 4 are cross-sectional views of the structure of the active region in FIG. 1. FIG. 3 depicts a cross-section of the structure of an outermost unit cell of the main effective region 1a and the current sensing portion 12, the outermost unit cell being outermost in the second direction Y (cross-section of the structure along cutting line X1-X2-X3-X4 in FIG. 1). FIG. 4 depicts a cross-section of the structure of the main effective region 1a. FIGS. 3 and 4 depict a portion of the unit cells of the main effective region 1a and the sensing effective region 12a. FIG. 4 depicts the structure along cutting line A-A' in FIGS. 5 and 6.

Figure 5:
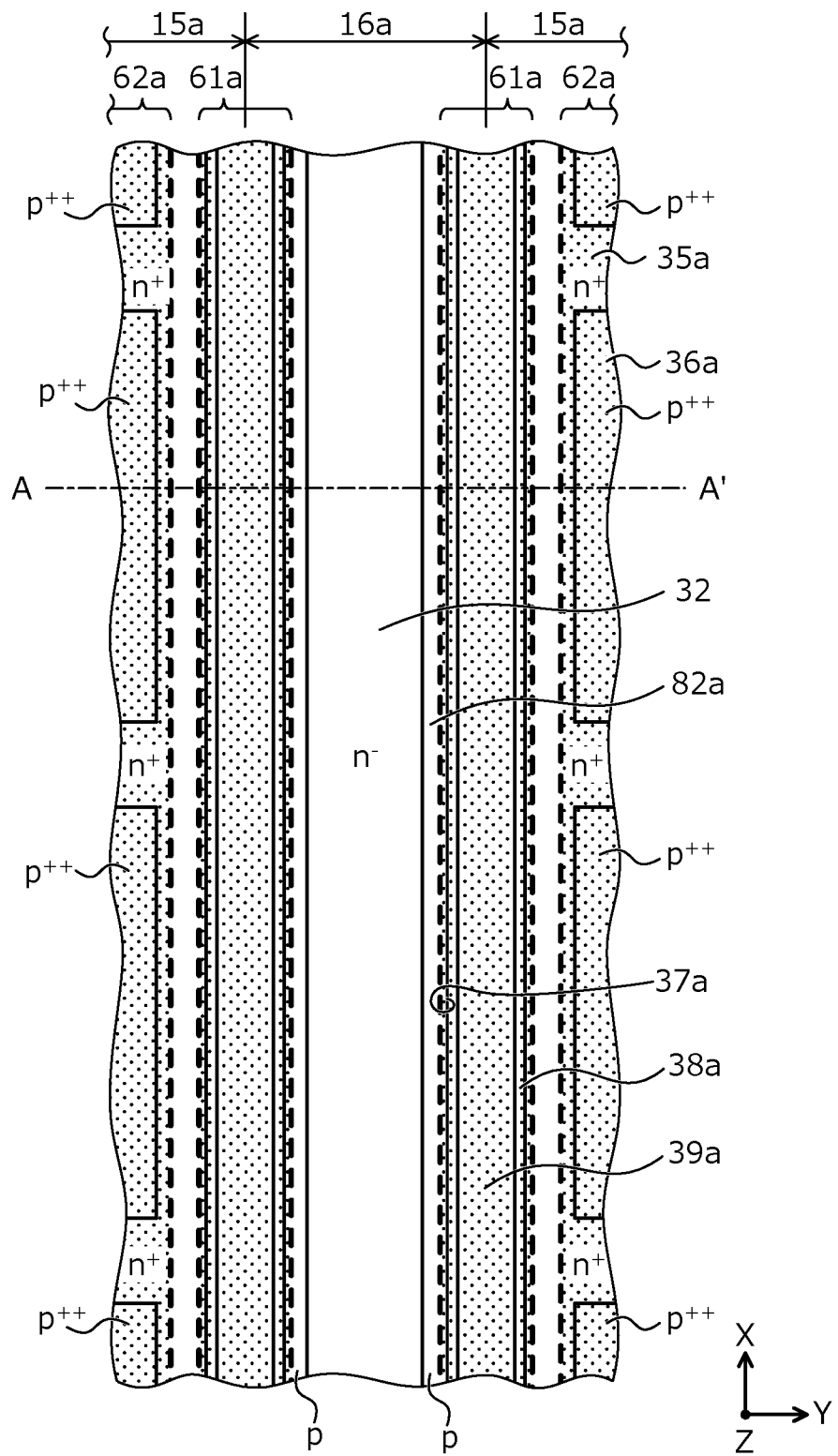
FIG. 5 is an enlarged plan view of a portion of a main effective region in FIG. 1.
Figure 6:
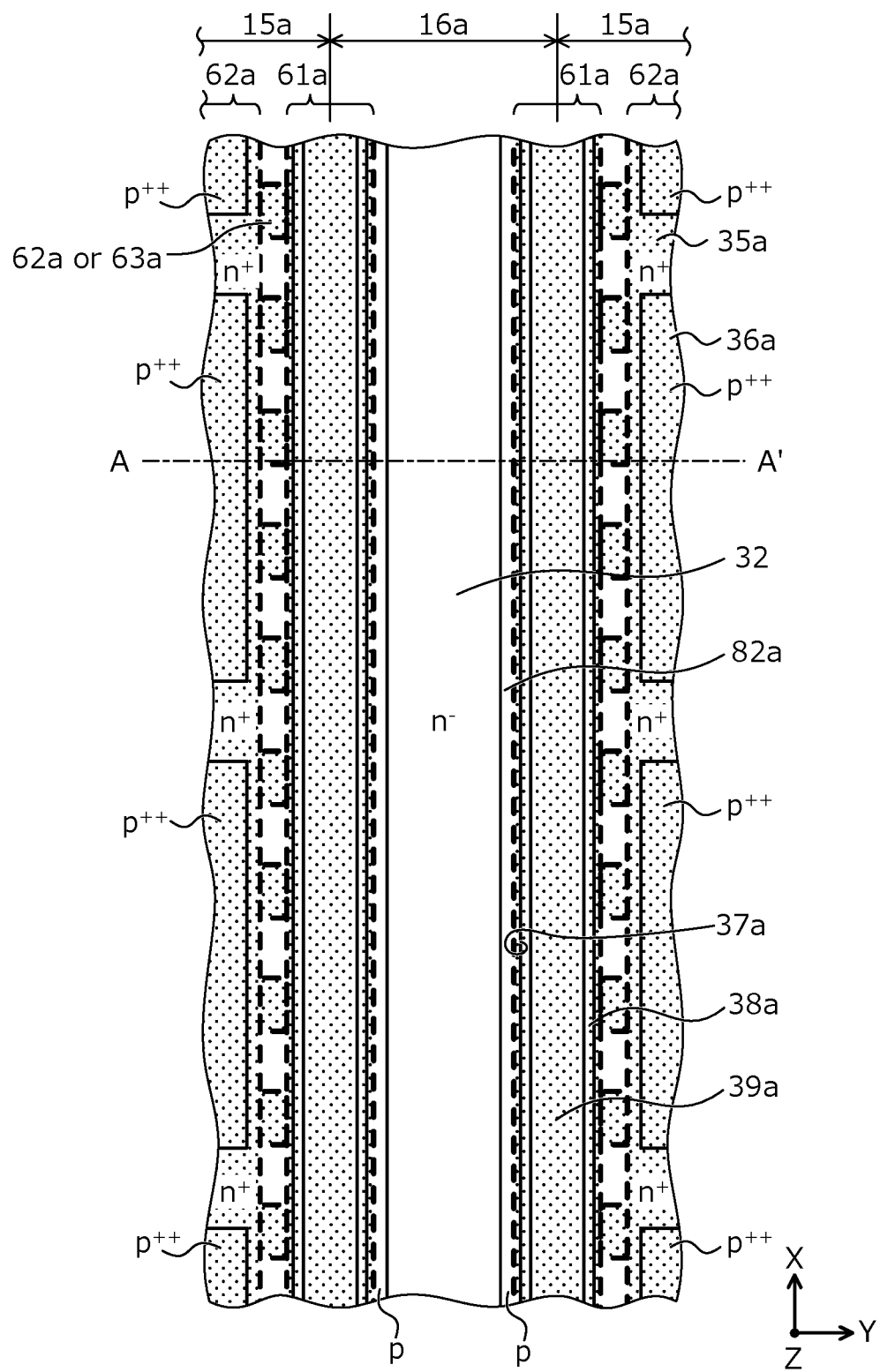
FIG. 6 is an enlarged plan view of a portion of the main effective region in FIG. 1.

FIGS. 5 and 6 are enlarged plan views of a portion of the main effective region in FIG. 1. FIGS. 5 and 6 depict a layout of first and the second p$^+$-type regions (first and second high-concentration regions) 61a, 62a (hatched portions between vertical dashed lines) that mitigate electric field applied to bottoms of the trenches 37a of the main semiconductor device element 11. In FIGS. 5 and 6, other than the first and the second p$^+$-type regions 61a, 62a, n$^+$-type source regions (third semiconductor regions) 35a, p$^{++}$-type contact regions 36a, and the trenches 37a, etc. are also depicted so that a planar arrangement of the first and the second p$^+$-type regions 61a, 62a is clear.

In the semiconductor substrate 10 at the front surface thereof, in the main MOS regions 15a of the main effective region 1a, the main semiconductor device element 11 has MOS gates (insulated gates having a 3-layered structure including a metal, an oxide film, and a semiconductor) having a trench gate structure configured by the p-type base regions 34a, the n$^+$-type source regions 35a, the p$^{++}$-type contact regions 36a, the trenches 37a, gate insulating films 38a, and gate electrodes 39a. An outer peripheral portion (portion closer to the chip end than is an outermost one of the trenches 37a closest to the chip end) of the main effective region 1a is configured to be free of the n$^+$-type source regions 35a. An impurity concentration of the n$^+$-type source regions 35a is higher than an impurity concentration of the n$^-$-type drift region 32. An impurity concentration of the p$^{++}$-type contact regions 36a is higher than an impurity concentration of the p-type base regions 34a. In the main MOS regions 15a, on the front surface of the semiconductor substrate 10, are NiSi films (ohmic electrodes) 41a in ohmic contact with the p$^{++}$-type contact regions 36a and the n$^+$-type source regions 35a.

The main semiconductor device element 11, in the main SBD regions 16a of the main effective region 1a, has first and second p-type regions (fourth and fifth semiconductor regions) 81a, 82a in the semiconductor substrate 10, at the front surface of the semiconductor substrate 10. Further, the main semiconductor device element 11 has Schottky electrodes (first Schottky electrodes) 83a forming Schottky junctions with the n$^-$-type drift region 32, on the front surface of the semiconductor substrate 10, in the main SBD regions 16a of the main effective region 1a. The main SBD regions 16a are free of the p-type base regions (second semiconductor regions) 34a, the n$^+$-type source regions 35a, and the p$^{++}$-type contact regions 36a.

The semiconductor substrate 10 is an epitaxial substrate in which first and second n$^-$-type epitaxial layers 72, 73 are sequentially formed by epitaxial growth on a front surface of an n$^+$-type starting substrate 71 containing silicon carbide. A main surface of the semiconductor substrate 10 having the second n$^-$-type epitaxial layer 73 (surface of the second n$^-$-type epitaxial layer 73) is assumed as the front surface while a main surface thereof having the n$^+$-type starting substrate 71 (back surface of the n$^+$-type starting substrate 71) is assumed as a back surface. The n$^+$-type starting substrate 71 is an n$^+$-type drain region 31 common to the main semiconductor device element 11 and the current sensing portion 12.

The first and the second n$^-$-type epitaxial layers 72, 73 constitute the n$^-$-type drift region 32 common to the main semiconductor device element 11 and the current sensing portion 12. The trenches 37a penetrate through the second n$^-$-type epitaxial layer 73 from the front surface of the semiconductor substrate 10 in the depth direction Z and reach inside the first n$^-$-type epitaxial layer 72. The trenches 37a, in an entire area of the main effective region 1a, extend in a striped pattern in the first direction X parallel to the front surface of the semiconductor substrate 10 and are disposed adjacent to one another in the second direction Y (refer to FIG. 5).

The trenches 37a adjacent to one another in the second direction Y each has a center in the second direction Y, and a region between the center of one of the trenches 37a and the center of a trench 37a adjacent thereto is one of the main MOS regions 15a or one of the main SBD regions 16a, the main MOS regions 15a being respectively adjacent to the main SBD regions 16a and sharing the trenches 37a with the main SBD regions 16a. The main MOS regions 15a and the main SBD regions 16a are disposed repeatedly alternating one another in the second direction Y with the trenches 37a respectively intervening therebetween. In the trenches 37a, the gate electrodes 39a are provided via the gate insulating films 38a, respectively, the gate electrodes 39a each extending in a linear shape in the first direction X in which the trenches 37a extend.

The p-type base regions 34a, the n$^+$-type source regions 35a, and the p$^{++}$-type contact regions 36a are diffused regions formed in the second n$^-$-type epitaxial layer 73 by ion implantation from the front surface of the semiconductor substrate 10. The p-type base regions 34a, the n$^+$-type source regions 35a, and the p$^{++}$-type contact regions 36a are selectively provided in surface regions of the semiconductor substrate 10, at the front surface of the semiconductor substrate 10, in each of the main MOS regions 15a. The p-type base regions 34a reach an interface between the second n$^-$-type epitaxial layer 73 and the first n$^-$-type epitaxial layer 72 in the depth direction Z.

The p-type base regions 34a may terminate at positions shallower from the front surface of the semiconductor substrate 10 than do the bottoms of the trenches 37a or may reach inside the first n$^-$-type epitaxial layer 72. The p-type base regions 34a, for example, extend in substantially an entire area of the main non-operating region 1b excluding the sensing effective region 12a. The n$^+$-type source regions 35a and the p$^{++}$-type contact regions 36a are selectively provided between the front surface of the semiconductor substrate 10 and the p-type base regions 34a, in contact with the p-type base regions 34a.

The n$^+$-type source regions 35a and the p$^{++}$-type contact regions 36a are exposed at the front surface of the semiconductor substrate 10. Being exposed at the front surface of the semiconductor substrate 10 means that the n$^+$-type source regions 35a and the p$^{++}$-type contact regions 36a are in contact with the later-described NiSi films 41a by later-described first contact holes 40a in the interlayer insulating film 40. Between the trenches 37a adjacent to one another, the n$^+$-type source regions 35a and the p$^{++}$-type contact regions 36a are disposed repeatedly alternating one another in the first direction X that is a same direction in which the gate electrodes 39a extend (for example, refer to FIG. 5).

The n$^+$-type source regions 35a are in contact with the gate insulating films 38a at sidewalls of the trenches 37a; the p$^{++}$-type contact regions 36a are in contact with the n$^+$-type source regions 35a at positions separate from the trenches 37a. Between the trenches 37a adjacent to one another, the n$^+$-type source regions 35a form a ladder-like shape surrounding peripheries of the p$^{++}$-type contact regions 36a in a plan view thereof. Therefore, the n$^+$-type source regions 35a have portions extending along the sidewalls of the trenches 37a in the first direction X and portions between the p$^{++}$-type contact regions 36a adjacent thereto in the first direction X.

The p$^{++}$-type contact regions 36a may be omitted. In this case, instead of the p$^{++}$-type contact regions 36a, the p-type base regions 34a reach and are exposed at the front surface of the semiconductor substrate 10, peripheries of surface regions of the p-type base regions 34a exposed at the front surface of the semiconductor substrate 10 are surrounded by the n$^+$-type source regions 35a. In the semiconductor substrate 10, between the p-type base regions 34a and the n$^+$-type drain region 31 (the n$^+$-type starting substrate 71), the n$^-$-type drift region 32 is provided in contact with the p-type base regions 34a and the n$^+$-type drain region 31.

Between the p-type base regions 34a and the n$^-$-type drift region 32 and in contact with these regions, n-type current spreading regions 33a having an impurity concentration higher than the impurity concentration of the n$^-$-type drift region 32 may be provided. The n-type current spreading regions 33a are a so-called current spreading layer (CSL) that reduce carrier spreading resistance. Further, in the semiconductor substrate 10, at positions closer to the n$^+$-type drain region 31 than are positions of the bottoms of the trenches 37a, the first and the second p$^+$-type regions 61a, 62a that mitigate electric field applied to the bottoms of the trenches 37a are provided.

The first and the second p$^+$-type regions 61a, 62a each extends in a linear shape of substantially a same length as that of the trenches 37a, in the first direction X that is the same direction in which the trenches 37a extend. Distances from the first and the second p$^+$-type regions 61a, 62a to the n$^+$-type drain region 31 in the depth direction Z suffice to be substantially the same and depth positions of the first and the second p$^+$-type regions 61a, 62a may be variously changed. For example, the first and the second p$^+$-type regions 61a, 62a may terminate in the n-type current spreading regions 33a with peripheries of the first and the second p$^+$-type regions 61a, 62a being surrounded by the n-type current spreading regions 33a (not depicted).

The first and the second p$^+$-type regions 61a, 62a may reach positions (interfaces between the n-type current spreading regions 33a and the n$^-$-type drift region 32) about a same distance from the n$^+$-type drain region 31 as are the n-type current spreading regions 33a and may be in contact with the n$^-$-type drift region 32 (not depicted). Alternatively, the first and the second p$^+$-type regions 61a, 62a may extend in the depth direction Z to positions closer to the n$^+$-type drain region 31 than are positions of the n-type current spreading regions 33a and may terminate in the n$^-$-type drift region 32 (refer to FIGS. 3 and 4).

The first p$^+$-type regions 61a are provided separate from the p-type base regions 34a, respectively facing the bottoms of the trenches 37a in the depth direction Z. The first p$^+$-type regions 61a each has a width (width in the second direction Y) wider than a width of the trenches 37a, the first p$^+$-type regions 61a respectively reaching the bottoms of the trenches 37a and being in contact with the gate insulating films 38a at the bottoms and bottom corner portions of the trenches 37a. The bottom corner portions of the trenches 37a are portions where the bottom and the sidewalls of the trenches 37a are connected. The bottom corner portions of the trenches 37a may be chamfered into an arc shape.

While the first p$^+$-type regions 61a may have a floating potential (FIG. 5), the first p$^+$-type regions 61a may be electrically connected to the second p$^+$-type regions 62a and fixed to the potential of the source pad 21a. In an instance in which the first p$^+$-type regions 61a are fixed to the source pad 21a, p$^+$-type regions 63a are disposed at predetermined positions between the first and the second p$^+$-type regions 61a, 62a or instead of the p$^+$-type regions 63a, portions of the first p$^+$-type regions 61a may extend toward the second p$^+$-type regions 62a whereby, the first p$^+$-type regions 61a may be partially connected to the second p$^+$-type regions 62a (FIG. 6).

The first p$^+$-type regions 61a are fixed to the potential of the source pad 21a, whereby holes (positive holes) generated in the n$^-$-type drift region 32 during avalanche breakdown by pn junctions between the first p$^+$-type regions 61a and the n-type current spreading regions 33a or the n$^-$-type drift region 32 (or both) may be efficiently discharged to the source electrode. As a result, when the main semiconductor device element 11 is OFF, electric field applied to the gate insulating films 38a at the bottoms of the trenches 37a is assuredly mitigated and reliability of the main semiconductor device element 11 may be enhanced.

In the main MOS regions 15a, between the trenches 37a adjacent to one another, the second p$^+$-type regions 62a are respectively provided separate from the first p$^+$-type regions 61a and the trenches 37a, and in contact with the p-type base regions 34a. The second p$^+$-type regions 62a are provided only in the main MOS regions 15a and are not provided in the main SBD regions 16a. The n-type current spreading regions 33a and the first and the second p$^+$-type regions 61a, 62a are diffused regions formed in the first n$^-$-type epitaxial layer 72 by ion implantation.

The first and the second p-type regions 81a, 82a are diffused regions formed in the second n$^-$-type epitaxial layer 73 by ion implantation from the front surface of the semiconductor substrate 10 or ion implantation from the sidewalls of the trenches 37a. The first and the second p-type regions 81a, 82a are selectively provided in surface regions of the semiconductor substrate 10, at the front surface of the semiconductor substrate 10, in the main SBD regions 16a. The first p-type regions 81a reach the bottom corner portions of the trenches 37a in the depth direction Z, from the front surface of the semiconductor substrate 10.

The first p-type regions 81a are connected to the first p$^+$-type regions 61a near the bottom corner portions of the trenches 37a. The first p-type regions 81a are provided along the sidewalls of the trenches 37a, in contact with the gate insulating films 38a at an entire area of surfaces of the sidewalls of the trenches 37a. The first p-type regions 81a each has a width (distance from the sidewalls of the trenches 37a in the second direction Y) w1 that is, for example, substantially equal to a width (distance) w3 that the first p$^+$-type regions 61a protrude in the second direction Y toward a center of an adjacent main SBD region 16a, from an SBD-sidewall of a respective trench 37a (the SBD-sidewall being in the main SBD region 16a).

The second p-type regions 82a are provided further from the sidewalls of the trenches 37a than are the first p-type regions 81a and are adjacent to the first p-type regions 81a. The second p-type regions 82a may terminate a positions shallower from the front surface of the semiconductor substrate 10 in the depth direction Z than do the first p-type regions 81a. In other words, a depth of the second p-type regions 82a may be shallower than a depth of the first p-type regions 81a. The shallower are the second p-type regions 82a, the greater an effective area of the SBDs formed by the Schottky electrodes 83a in the main SBD regions 16a may be increased. The depth of the second p-type regions 82a may be at most half of a depth of the trenches 37a. Further, in the main SBD regions 16a, recesses are provided at the front surface of the semiconductor substrate 10 and in these recesses, the Schottky electrodes 83a may be provided and in this instance, the depth of the second p-type regions 82a may be at least two times a depth of the Schottky electrodes 83a.

The second p-type regions 82a are provided between the first p-type regions 81a and the later-described Schottky electrodes 83a and are in contact with the Schottky electrodes 83a. The first p-type regions 81a are formed having the width w1 that is at most about 0.2 µm, which is relatively narrow and therefore, by providing the second p-type regions 82a having a predetermined width w2, the first p-type regions 81a and the Schottky electrodes 83a are assuredly connected electrically. Entire surfaces of SBD-sidewalls (sidewalls in the main SBD regions 16a) and the bottom corner portions of the trenches 37a are surrounded by p-type regions including the first and the second p-type regions 81a, 82a, and the first $p^+$-type regions 61a.

During SBD operation by the main SBD regions 16a, high electric field is applied to the trenches 37a, at the bottom corner portions thereof in the main SBD regions 16a. Therefore, as described above, spanning the bottoms of the trenches 37a from the SBD-sidewalls thereof, the first and the second p-type regions 81a, 82a and the first $p^+$-type regions 61a are provided so as to surround the bottom corner portions that face the main SBD regions 16a. As a result, during SBD operation by the main SBD regions 16a, electric field applied to the trenches 37a, at the bottom corner portions thereof in the main SBD regions 16a, is mitigated.

In the main SBD regions 16a, in a portion between the trenches 37a adjacent to one another excluding the first and the second p-type regions 81a, 82a, the second $n^-$-type epitaxial layer 73 is left in the same state as that during epitaxial growth without introduction of an impurity by ion implantation or the like. The portions of the second $n^-$-type epitaxial layer 73 left between the trenches 37a adjacent to one another in the main SBD regions 16a constitute the $n^-$-type drift region 32; and the $n^-$-type drift region 32 and the second p-type regions 82a are exposed at the front surface of the semiconductor substrate 10.

Being exposed at the front surface of the semiconductor substrate 10 means that the $n^-$-type drift region 32 and the second p-type regions 82a are in contact with the Schottky electrodes 83a through later-described second contact holes 84a of the interlayer insulating film 40. The second p-type regions 82a are in contact with the $n^-$-type drift region 32 in the second direction Y. In an instance in which the second p-type regions 82a terminate at positions shallower from the front surface of the semiconductor substrate 10 in the depth direction Z than do the first p-type regions 81a, the first p-type regions 81a are also in contact with the $n^-$-type drift region 32 in the second direction Y.

The first and the second p-type regions 81a, 82a may each have a same impurity concentration; however, the higher is the breakdown voltage of the main semiconductor device element 11, the impurity concentration of the second p-type regions 82a may be optimized by being made lower than the impurity concentration of the first p-type regions 81a. The lower the impurity concentration of the second p-type regions 82a is compared to the impurity concentration of the first p-type regions 81a, the greater an effect (mitigation of electric field applied to the trenches 37a, at the bottom corner portions thereof in the main SBD regions 16a) by the first and the second p-type regions 81a, 82a and the first $p^+$-type regions 61a is facilitated. For example, the impurity concentration of the first p-type regions 81a is in a range from $1\times10^{17}/cm^3$ to $8\times10^{18}/cm^3$. The impurity concentration of the second p-type regions 82a is about equal to, or not more than half of the impurity concentration of the first p-type regions 81a.

Portions of the first and the second $n^-$-type epitaxial layers 72, 73 excluding diffused regions formed by ion implantation (the p-type base regions 34a, the $n^+$-type source regions 35a, the $p^{++}$-type contact regions 36a, the n-type current spreading regions 33a, the first and the second $p^+$-type regions 61a, 62a, and the first and the second p-type regions 81a, 82a) constitute the $n^-$-type drift region 32. The interlayer insulating film 40 is provided in substantially an entire area of the front surface of the semiconductor substrate 10 and covers the gate electrodes 39a of all of the unit cells of the main semiconductor device element 11. All of the gate electrodes 39a are electrically connected to one another by a portion not depicted.

The first and the second contact holes 40a, 84a penetrating the interlayer insulating film 40 in the depth direction Z are provided. The $n^+$-type source regions 35a and the $p^{++}$-type contact regions 36a disposed between the trenches 37a adjacent to one another are exposed in the first contact holes 40a, in the main MOS regions 15a. The second p-type regions 82a and the $n^-$-type drift region 32 disposed between the trenches 37a adjacent to one another are exposed in the second contact holes 84a, in the main SBD regions 16a. The first p-type regions 81a are covered by the interlayer insulating film 40.

The nickel silicide (NixSiy, where, x, y are integers, the nickel silicide being $Ni_2Si$ or thermally stable $NiSi_2$, hereinafter, collectively "NiSi") films 41a are in ohmic contact with the semiconductor substrate 10 in the first contact holes 40a and are electrically connected to the $n^+$-type source regions 35a and the $p^{++}$-type contact regions 36a. In an instance in which the $p^{++}$-type contact regions 36a are omitted, instead of the $p^{++}$-type contact regions 36a, the p-type base regions 34a are exposed in the first contact holes 40a and are electrically connected to the NiSi films 41a.

The Schottky electrodes 83a, in the second contact holes 84a, form Schottky junctions with the $n^-$-type drift region 32, are in contact with and electrically connected to the second p-type regions 82a. The Schottky electrodes 83a are not in contact with the first p-type regions 81a. In the second contact holes 84a, SBDs using rectification of Schottky barriers formed at junction surfaces (the front surface of the semiconductor substrate 10) between the Schottky electrodes 83a and the $n^-$-type drift region 32 are formed. The Schottky electrodes 83a, for example, are titanium (Ti) films.

In an entire area of surfaces of the interlayer insulating film 40, the NiSi films 41a, and the Schottky electrodes 83a in the main effective region 1a, a barrier metal 46a is provided along surfaces of the interlayer insulating film 40, the NiSi films 41a, and the Schottky electrodes 83a. As a result, the Schottky electrodes 83a are in contact with a later-described first Ti film 43a configuring the barrier metal 46a and are electrically connected to the source electrode. The barrier metal 46a has a function of preventing interaction between metal films of the barrier metal 46a or between regions facing each other across the barrier metal 46a.

The barrier metal 46a, for example, may have a layered structure in which a first titanium nitride (TiN) film 42a, the first Ti film 43a, a second TiN film 44a, and a second Ti film 45a are sequentially stacked. The first TiN film 42a covers an entire area of the surface of the interlayer insulating film 40 in the main effective region 1a. The first TiN film 42a is not provided on the front surface of the semiconductor substrate 10, in portions where the NiSi films 41a and the Schottky electrodes 83a are formed. The first Ti film 43a is provided in an entire area of surfaces of the first TiN film 42a, the NiSi films 41a, and the Schottky electrodes 83a.

The Schottky electrodes 83a may be configured by portions of the first Ti film 43a, on the front surface of the semiconductor substrate 10, in the second contact holes 84a. The second TiN film 44a is provided in an entire area of a surface of the first Ti film 43a. The second Ti film 45a is provided in an entire area of a surface of the second TiN film 44a. The source pad 21a is provided in an entire area of a surface of the second Ti film 45a. The source pad 21a is electrically connected to the $n^+$-type source regions 35a and the $p^{++}$-type contact regions 36a, via the barrier metal 46a and the NiSi films 41a.

Further, the source pad 21a is electrically connected to the Schottky electrodes 83a, via the barrier metal 46a. As a result, the SBDs of the main SBD regions 16a are connected in antiparallel to the MOSFETs of the main MOS regions 15a. The source pad 21a, for example, may be an aluminum (Al) film, an aluminum-silicon (Al—Si) film, or an aluminum-silicon-copper (Al—Si—Cu) film having a thickness of about 5 μm. The source pad 21a, the barrier metal 46a, and the NiSi films 41a function as the source electrode (first electrode) of the main semiconductor device element 11.

First ends of terminal pins 48a are bonded on the source pad 21a, via plating films 47a and a solder layer (not depicted). Second ends of the terminal pins 48a are bonded to a metal bar (not depicted) disposed so as to face the front surface of the semiconductor substrate 10. Further, the second ends of the terminal pins 48a are exposed outside a case (not depicted) in which the semiconductor substrate 10 is mounted and are electrically connected to an external device (not depicted). The terminal pins 48a are soldered to the plating films 47a in a substantially upright state with respect to the front surface of the semiconductor substrate 10.

The terminal pins 48a are wiring members having a round bar-like (cylindrical) shape of a predetermined diameter according to the current capability of the main semiconductor device element 11, and are connected to an external ground potential (minimum potential). The terminal pins 48a are external connection terminals that lead out potential of the source pad 21a to an external destination. First and second protective films 49a, 50a are, for example, polyimide films. The first protective film 49a covers a portion of the surface of the source pad 21a other than portions thereof having the plating films 47a. The second protective films 50a cover borders between the plating films 47a and the first protective film 49a.

A drain electrode (second electrode) 51 is in ohmic contact with an entire area of the back surface of the semiconductor substrate 10 (the back surface of the $n^+$-type starting substrate 71). On the drain electrode 51, a drain pad (electrode pad, not depicted) having a layered structure in which, for example, a Ti film, a nickel (Ni) film, and a gold (Au) film are sequentially stacked is provided. The drain pad is soldered to a metal base plate (not depicted) formed by, for example, copper (Cu) foil of an insulated substrate, and at least a portion of the drain pad is in contact with a base part of a cooling fin (not depicted) via the metal base plate.

In this manner, the terminal pins 48a are bonded to the source pad 21a of the front surface of the semiconductor substrate 10 and the drain pad of the back surface is bonded to the metal base plate of the insulated substrate, whereby the semiconductor substrate 10 has a double-sided cooling structure in which a cooling structure is provided on both sides of the semiconductor substrate 10. Heat generated by the semiconductor substrate 10 is dissipated from a fin portion of the cooling fin, via the metal base plate bonded to the drain pad of the back surface of the semiconductor substrate 10 and is dissipated from the metal bar to which the terminal pins 48a of the front surface of the semiconductor substrate 10 are bonded.

The current sensing portion 12 includes the sensing MOS regions 15b and the first sensing SBD regions 16b respectively having same configurations as the configurations of the main MOS regions 15a and the main SBD regions 16a of the main semiconductor device element 11. In other words, the current sensing portion 12 includes the p-type base regions (sixth semiconductor regions) 34b, $n^+$-type source regions 35b, $p^{++}$-type contact regions 36b, the trenches 37b, gate insulating films 38b, gate electrodes 39b, the interlayer insulating film 40, first and the second $p^+$-type regions 61b, 62b, and first and second p-type regions 81b, 82b, respectively configured similarly to corresponding regions of the main semiconductor device element 11.

Parts of the MOS gates of the current sensing portion 12 are provided in the sensing MOS regions 15b. The p-type base regions 34b are isolated from the p-type base regions 34a of the main semiconductor device element 11 by an $n^-$-type region 32a in a surface region of the semiconductor substrate 10, at the front surface of the semiconductor substrate 10. Further, one of the p-type base regions 34b is provided in an entire area of the third sensing region 19 of the sensing effective region 12a. The p-type base regions 34b of the first and the third sensing regions 17, 19 of the sensing effective region 12a are partially connected by a non-depicted portion.

In an instance in which the $p^{++}$-type contact regions 36b are omitted, similarly to the main semiconductor device element 11, instead of the $p^{++}$-type contact regions 36b, the p-type base regions 34b are exposed at the front surface of the semiconductor substrate 10. The first $p^+$-type regions 61b face the trenches 37b in the depth direction Z; and the second $p^+$-type regions 62b are disposed only in the sensing MOS regions 15b. The first and the second p-type regions 81b, 82b are disposed in the first sensing SBD regions 16b. The current sensing portion 12, similarly to the main semiconductor device element 11, may have n-type current spreading regions 33b in the sensing MOS regions 15b.

The sensing MOS regions 15b and the first sensing SBD regions 16b, as described above, are disposed in the first sensing region (current sensing region) 17 of the sensing effective region 12a. The trenches 37b adjacent to one another in the second direction Y each as a center in the second direction Y and a region between the center of one of the trenches 37b and the center of a trench 37b adjacent thereto is one of the sensing MOS regions 15b or one of the first sensing SBD regions 16b, the sensing MOS regions 15b being respectively adjacent to the first sensing SBD regions 16b and sharing the trenches 37b with the first sensing SBD regions 16b. The sensing MOS regions 15b and the first sensing SBD regions 16b are disposed repeatedly alternating one another in the second direction Y with the trenches 37b adjacent thereto, intervening therebetween.

In the first sensing region 17 of the sensing effective region 12a as well, similarly to the main effective region 1a, entire surfaces of SBD-sidewalls and bottom corner portions of the trenches 37b are surrounded by p-type regions including the first and the second p-type regions 81b, 82b, and the first $p^+$-type regions 61b. Therefore, similarly to the main SBD regions 16a, during operation of the SBDs formed in the first sensing SBD regions 16b by the Schottky electrodes 83b, electric field applied to the trenches 37b, at the bottom corner portions thereof in the first sensing SBD regions 16b is mitigated.

Widths w11, w12 of the first and the second p-type regions 81b, 82b are set similarly to the main semiconductor device element 11. The width w11 of the first p-type regions 81b, for example, is substantially a same as a width (distance) w13 that the first p$^+$-type regions 61b protrude in the second direction Y toward a center of an adjacent one of the first sensing SBD regions 16b, from the SBD-sidewalls of the trenches 37b. The first p-type regions 81b are formed having the width w11 that is at most about 0.2 µm, which is relatively narrow and therefore, the second p-type regions 82b are provided having the predetermined width w12, assuredly connecting the first p-type regions 81b and the Schottky electrodes 83b electrically.

In the second sensing SBD region 18 of the sensing effective region 12a, similarly to the first sensing SBD regions 16b, the second n$^-$-type epitaxial layer 73 is left in a same state as that during epitaxial growth without introduction of an impurity by ion implantation or the like. Along an SBD-sidewall of the trench 37b disposed at a border between the second sensing SBD region 18 and the first sensing SBD regions 16b (the SBD-sidewall being in the second sensing SBD region 18), first and second p-type regions 81c, 82c may be provided similarly to the first and the second p-type regions 81b, 82b of the first sensing SBD regions 16b.

Portions of the first and the second n$^-$-type epitaxial layers 72, 73 excluding diffused regions (the p-type base regions 34b, the n$^+$-type source regions 35b, the p$^{++}$-type contact regions 36b, the n-type current spreading regions 33b, the first and the second p$^+$-type regions 61b, 62b, the first p-type regions 81b, 81c, and the second p-type regions 82b, 82c) formed by ion implantation constitute the n$^-$-type drift region 32. The interlayer insulating film 40 covers the gate electrodes 39b of all of the unit cells of the current sensing portion 12. All of the gate electrodes 39b are electrically connected to one another by a non-depicted portion.

In the interlayer insulating film 40 in the sensing effective region 12a, third, fourth, fifth, and sixth contact holes 40b, 84b, 84c, 40c that penetrate through the interlayer insulating film 40 in the depth direction Z are provided. The third contact holes 40b, similarly to the first contact holes 40a, expose the n$^+$-type source regions 35b and the p$^{++}$-type contact regions 36b of the sensing MOS regions 15b. The fourth contact holes 84b, similarly to the second contact holes 84a, expose the second p-type regions 82b and the n$^-$-type drift region 32 of the first sensing SBD regions 16b.

The first p-type regions 81b of the first sensing SBD regions 16b are covered by the interlayer insulating film 40. In the fifth contact hole 84c, the n$^-$-type drift region 32 in the second sensing SBD region 18 is exposed. In an instance in which the first and the second p-type regions 81c, 82c are provided in the second sensing SBD region 18, the second p-type regions 82c are further exposed in the fifth contact hole 84c. The fifth contact hole 84c is provided in a closed curve shape surrounding the periphery of the first sensing region 17. The first p-type regions 81c are covered by the interlayer insulating film 40. In the sixth contact hole 40c, the p-type base region 34b of the third sensing region 19 is exposed. The sixth contact hole 40c is provided in a closed curve shape surrounding the periphery of the second sensing SBD region 18.

In the third contact holes 40b, NiSi films (ohmic electrodes) 41b are each in ohmic connect with the semiconductor substrate 10 and electrically connected to the n$^+$-type source regions 35b and the p$^{++}$-type contact regions 36b. In an instance in which the p$^{++}$-type contact regions 36b are omitted, instead of the p$^{++}$-type contact regions 36b, the p-type base regions 34b are respectively exposed in the third contact holes 40b and electrically connected to the NiSi films 41b. In the sixth contact hole 40c, a NiSi film 41c is in ohmic contact with the semiconductor substrate 10 and electrically connected to the p-type base region 34b.

In the fourth contact holes 84b, the Schottky electrodes 83b respectively form Schottky junctions with the n$^-$-type drift region 32, are in contact with and electrically connected to the second p-type regions 82b. The Schottky electrodes 83b are not in contact with the first p-type regions 81b. In the fifth contact hole 84c, an SBD using rectification of a Schottky barrier formed at a junction surface (the front surface of the semiconductor substrate 10) between a Schottky electrode (second Schottky electrode) 83c and the n$^-$-type drift region 32 is formed. This SBD is provided in a closed curve shape surrounding the periphery of the first sensing region 17, thereby protecting the first sensing region 17 from positive hole current.

The Schottky electrode 83c forms a Schottky junction with the n$^-$-type drift region 32, in the fifth contact hole 84c. In an instance in which the first and the second p-type regions 81c, 82c are provided in the second sensing SBD region 18, the Schottky electrode 83c is further in contact with the second p-type regions 82c and electrically connected to the second p-type regions 82c in the fifth contact hole 84c. The Schottky electrode 83c is not in contact with the first p-type regions 81c. The Schottky electrodes 83b, 83c, for example, are Ti films.

In the sensing effective region 12a, a barrier metal 46b is provided in an entire area of surfaces of the interlayer insulating film 40, the NiSi films 41b, 41c, and the Schottky electrodes 83b, 83c. The barrier metal 46b extends on the interlayer insulating film 40 in the sensing non-operating region 12b. The barrier metal 46b has a layered structure, for example, like that of the barrier metal 46a of the main semiconductor device element 11. In other words, the barrier metal 46b is configured by a first TiN film 42b, a first Ti film 43b, a second TiN film 44b, and a second Ti film 45b.

The first TiN film 42b covers an entire area of the surface of the interlayer insulating film 40 in the sensing effective region 12a and the sensing non-operating region 12b. The first Ti film 43b is provided in an entire area of surfaces of the first TiN film 42b, the NiSi films 41b, 41c, and the Schottky electrodes 83b, 83c. The Schottky electrodes 83b, 83c may be respectively configured by portions of the first Ti film 43b on the front surface of the semiconductor substrate 10, in the fourth and the fifth contact holes 84b, 84c. The second TiN film 44b is provided in an entire area of a surface of the first Ti film 43b.

The second Ti film 45b is provided in an entire area of a surface of the second TiN film 44b. In an entire area of a surface of the second Ti film 45b, the OC pad 22 is provided separate from the source pad 21a. The OC pad 22 is electrically connected to the n$^+$-type source regions 35b and the p-type base regions 34b, via the barrier metal 46b and the NiSi films 41b. The OC pad 22 is electrically connected to the p-type base region (seventh semiconductor region) 34b of the third sensing region 19, via the barrier metal 46b and the NiSi film 41c.

The OC pad 22, the barrier metal 46b, and the NiSi films 41b, 41c function as a source electrode (third electrode) of the current sensing portion 12. The OC pad 22 is electrically connected to the Schottky electrodes 83b, 83c, via the barrier metal 46b. As a result, the SBDs of the first and the second sensing SBD regions 16b, 18 are connected in antiparallel to the MOSFETs of the sensing MOS regions 15b. The OC pad 22, for example, is formed concurrently with the source pad 21a by a same material as that of the source pad 21a.

In the sensing non-operating region 12b, terminal pins 48b are bonded on the OC pad 22, by a wiring structure similar to the wiring structure on the source pad 21a. The terminal pins 48b are wiring members having a round bar-like (cylindrical) shape of a diameter smaller than that of the terminal pins 48a. The terminal pins 48b, for example, are external connection terminals that lead out potential of the OC pad 22 to an external destination, and connect the OC pad 22 to a ground potential, via an external resistor (not depicted). Reference characters 47b, 49b, and 50b are a planting film, and first and second protective films configuring the wiring structure on the OC pad 22.

The p-type base regions 34a of the main effective region 1a and the p-type base regions 34b of the sensing effective region 12a are isolated from a p-type region (not depicted) for device element isolation, by a non-depicted $n^-$-type region of a surface region of the semiconductor substrate 10. The p-type region for device element isolation is provided in the edge termination region 2, in a substantially rectangular shape surrounding the periphery of the active region 1, and is a floating p-type region that forms parasitic diodes electrically isolating the active region 1 and the edge termination region 2, by a pn junction with the $n^-$-type drift region 32.

The temperature sensing portion 13, for example, may be a polysilicon diode formed by a pn junction formed in a polysilicon film on the interlayer insulating film 40 or may be diffusion diode formed by a pn junction formed in a diffusion region in the semiconductor substrate 10. The temperature sensing portion 13 is electrically isolated from the main semiconductor device element 11 and the current sensing portion 12 by the interlayer insulating film 40 and a device element isolating structure. The anode pad 23a and the cathode pad 23b are respectively connected to a p-type anode region and an n-type cathode region of a diode constituting the temperature sensing portion 13.

The anode pad 23a and the cathode pad 23b, for example, are formed concurrently with the source pad 21a by a same material as that of the source pad 21a. On the anode pad 23a and on the cathode pad 23b, respectively, terminal pins (not depicted) are bonded by wiring structures similar to that on the source pad 21a. The terminal pins are external connection terminals that lead out potential of the anode pad 23a and the cathode pad 23b, respectively, and are wiring members having a round bar-like (cylindrical) shape of a predetermined diameter according to the current capability of the temperature sensing portion 13.

Further, in the main non-operating region 1b, a gate pad portion 14 in which the gate pad 21b of the main semiconductor device element 11 is disposed is provided (refer to FIG. 1). The gate pad 21b is provided on the interlayer insulating film 40 in the main non-operating region 1b, separate from other electrode pads. The gate pad 21b, for example, is formed concurrently with the source pad 21a by a same material as that of the source pad 21a. Terminal pins (not depicted) are bonded on the gate pad 21b by a wiring structure similar to the wiring structure on the source pad 21a.

For other circuit portions such as the overvoltage protecting portion (not depicted) and the arithmetic circuit portion (not depicted) as well, predetermined electrode pads are disposed in predetermined portions of the front surface of the semiconductor substrate 10 and on these electrode pads, terminal pins (not depicted) are bonded by wiring structures similar to the wiring structure on the source pad 21a. Here, while an instance in which the main semiconductor device element 11 and the circuit portions protecting and controlling the main semiconductor device element 11 have wiring structures of the same configuration using pin-shaped wiring members (the terminal pins) is described as an example, instead of pin-shaped wiring members, the wiring structures may use a wire.

Operation of the semiconductor device 20 according to the first embodiment is described. In a state in which voltage (forward voltage) that is positive with respect to the source electrode (the source pad 21a) of the main semiconductor device element 11 is applied to the drain electrode 51 and voltage at least equal to a gate threshold voltage is applied to the gate electrodes 39a of the main semiconductor device element 11, in the main semiconductor device element 11, channels (n-type inversion layers) are formed in the p-type base regions 34a, in portions thereof along the trenches 37a. As a result, current from the $n^+$-type drain region 31 of the main semiconductor device element 11 passes through the channels, to the $n^+$-type source regions 35a and the main semiconductor device element 11 turns ON.

Under conditions similar to those of the main semiconductor device element 11, in a state in which voltage (forward voltage) that is positive with respect to the source electrode (the OC pad 22) of the current sensing portion 12 is applied to the drain electrode 51 and voltage at least equal to the gate threshold voltage is applied to the gate electrodes 39b of the current sensing portion 12, in the first sensing region 17, channels (n-type inversion layers) are formed in the p-type base regions 34b, in portions thereof along the trenches 37b. As a result, current from the $n^+$-type drain region 31 of the current sensing portion 12, to the $n^+$-type source regions 35b (hereinafter, sensing current) flows and the current sensing portion 12 turns ON.

Here, a state in which the main semiconductor device element 11 is ON and the current sensing portion 12 is ON is assumed. The sensing current flows through the current sensing portion 12, whereby a voltage drop occurs due to a resistor (not depicted) connected between a ground point and the $n^+$-type source regions 35b of the current sensing portion 12. The sensing current of the current sensing portion 12 increases according to the magnitude of the current flowing through the main semiconductor device element 11 and therefore, the voltage drop due to the resistor connected between the ground point and the $n^+$-type source regions 35b of the current sensing portion 12 also increases. Accordingly, by monitoring the size of the voltage drop due to the resistor, it becomes possible to detect overcurrent in the main semiconductor device element 11.

On the other hand, when voltage less than the gate threshold voltage is applied to the gate electrodes 39a, the main semiconductor device element 11 maintains the OFF state due to pn junctions between the first and the second $p^+$-type regions 61a, 62a, the p-type base regions 34a, the n-type current spreading regions 33a, and the $n^-$-type drift region 32 being reversed biased. The voltage less than the gate threshold voltage is further applied to the gate electrodes 39b of the current sensing portion 12 and the current sensing portion 12 maintains the OFF state due to pn junctions between the first and the second $p^+$-type regions 61b, 62b, the p-type base regions 34b, the n-type current spreading regions 33b, and the $n^-$-type drift region 32 being reversed biased.

When the main semiconductor device element 11 is OFF, a depletion layer spreads from the pn junctions between the first and the second p$^+$-type regions 61a, 62a, the p-type base regions 34a, the n-type current spreading regions 33a, and the n$^-$-type drift region 32, and electric field applied to the bottoms of the trenches 37a positioned closer to the source electrode than are the pn junctions is mitigated. When the current sensing portion 12 is OFF, a depletion layer spreads from the pn junctions between the first and the second p$^+$-type regions 61b, 62b, the p-type base regions 34b, the n-type current spreading regions 33b, and the n$^-$-type drift region 32, and electric field applied to the bottoms of the trenches 37b positioned closer to the source electrode than are the pn junctions is mitigated.

Furthermore, when the main semiconductor device element 11 is OFF and voltage (reverse voltage) that is negative with respect to the source electrode is applied to the drain electrode 51, in the main MOS regions 15a, voltage is applied in a forward direction to pn junction surfaces (hereinafter, pn junction surfaces of the main MOS regions 15a) between the first and the second p$^+$-type regions 61a, 62a, the p-type base regions 34, the n-type current spreading regions 33a, and the n$^-$-type drift region 32. Further, concurrently with this, voltage is applied in the forward direction to Schottky junction surfaces (hereinafter, Schottky junction surfaces of the main SBD regions 16a) between the n$^-$-type drift region 32 and the Schottky electrodes 83a of the main SBD regions 16a.

Built-in voltage of the pn junction surfaces of the main MOS regions 15a is in a range from about 3V to 5V and built-in voltage of Schottky junction surfaces of the main SBD regions 16a is at most 1V. Therefore, before forward current flows through the parasitic diodes formed by the pn junction surfaces of the main MOS regions 15a, forward current flows through the SBDs formed by the Schottky junction surfaces of the main SBD regions 16a. As a result, the flow of forward current through the parasitic diodes formed by the pn junction surfaces of the main MOS regions 15a may be suppressed. Thus, generation of crystalline defects occurring when parasitic diodes are driven may be suppressed.

By the flow of current in the forward direction through the SBDs formed by the Schottky junction surfaces of the main SBD regions 16a, high electric field is applied to the trenches 37a, at the bottom corner portions thereof in the main SBD regions 16a; however, as described above, the electric field applied to the trenches 37a, at the bottom corner portions thereof in the main SBD regions 16a is mitigated by the first and the second p-type regions 81a, 82a and the first p$^+$-type regions 61a provided from the SBD-sidewalls to the bottoms of the trenches 37a, so as to surround the bottom corner portions. Therefore, destruction resistance of the SBDs of the main SBD regions 16a may be enhanced.

When the current sensing portion 12 is OFF and voltage that is negative with respect to the source electrode is applied to the drain electrode 51, in the sensing MOS regions 15b, voltage is applied in the forward direction to pn junction surfaces (hereinafter, pn junction surfaces of the sensing MOS regions 15b) between the first and the second p$^+$-type regions 61b, 62b, the p-type base regions 34b, the n-type current spreading regions 33b, and the n$^-$-type drift region 32. Further, concurrently with this, voltage is applied in the forward direction to Schottky junction surfaces (hereinafter, the Schottky junction surfaces of the first and the second sensing SBD regions 16b, 18) between the n$^-$-type drift region 32 and the Schottky electrodes 83b, 83c of the first and the second sensing SBD regions 16b, 18.

Built-in voltage of the pn junction surfaces of the sensing MOS regions 15b is in a range from about 3V to 5V and built-in voltage of the Schottky junction surfaces of the first and the second sensing SBD regions 16b, 18 is at most 1V. Therefore, in the current sensing portion 12 as well, the flow of forward current in the SBDs formed by the Schottky junction surfaces of the first and the second sensing SBD regions 16b, 18 and the flow of forward current in the parasitic diodes formed by the pn junction surfaces of the sensing MOS regions 15b may be suppressed. Further, by the second sensing SBD region 18, positive hole current flowing around in from the main semiconductor device element 11 and a region near the current sensing portion 12, to the first sensing region 17 of the sensing effective region 12a may be suppressed.

Current flows in the forward direction through the SBDs formed by the Schottky junction surfaces of the first sensing SBD regions 16b, whereby high electric field is applied near the bottom corner portions of the trenches 37b in the first sensing SBD regions 16b; however, as described above, electric field applied to the trenches 37b, at the bottom corner portions thereof in the first sensing SBD regions 16b is mitigated by the first and the second p-type regions 81b, 82b and the first p$^+$-type regions 61b provided from the SBD-sidewalls to the bottoms of the trenches 37b, so as to surround the bottom corner portions. t Therefore, destruction resistance of the SBDs of the first sensing SBD regions 16b may be enhanced.

Further, during operation of the main semiconductor device element 11, in the temperature sensing portion 13, normally, current continuously flows from the anode pad 23a, through a pn junction between an anode region and a cathode region, to the cathode pad 23b. A curve (forward voltage characteristics) indicating a relationship between forward current and forward voltage of the temperature sensing portion 13 is dependent on temperature and the higher the temperature is, the smaller the forward voltage is. Thus, the forward voltage characteristics of the temperature sensing portion 13 are obtained in advance and, for example, are stored in a storage unit (not depicted). The temperature of the main semiconductor device element 11 may be detected based on the forward voltage characteristics of the temperature sensing portion 13 and measured values of the forward voltage of the temperature sensing portion 13.

For example, during operation of the main semiconductor device element 11, by the arithmetic circuit portion, forward voltage (voltage drop at the temperature sensing portion 13) between the anode pad 23a and the cathode pad 23b of the temperature sensing portion 13 at a normal temperature (for example, 25 degrees C.) is continuously monitored. When the forward voltage of the temperature sensing portion 13 decreases, the temperature of the main semiconductor device element 11 (the semiconductor substrate 10) may be calculated based on the forward voltage characteristics of the temperature sensing portion 13. Based on this calculation result, when a high temperature occurs in a portion of the main semiconductor device element 11, a supply of gate voltage to the main semiconductor device element 11 is suspended by the arithmetic circuit portion, suspending operation of the main semiconductor device element 11.

Next, a method of manufacturing the semiconductor device 20 according to the first embodiment is described. FIGS. 7, 8, 9, 10, 11, 12, 13, and 14 are cross-sectional views of states of the semiconductor device according to the first embodiment during manufacture. In FIGS. 7 to 14, states of cross-sections of the structure of the main SBD regions 16a of the main semiconductor device element 11 during manufacture are depicted disposed in a center. While parts of the other semiconductor device elements (high-function portions such as the current sensing portion 12, the temperature sensing portion 13, the overvoltage protecting portion, and the arithmetic circuit portion, etc., refer to FIGS. 1 to 3) fabricated on the same semiconductor substrate 10 as the main semiconductor device element 11 are not depicted, the parts of the other semiconductor device elements and the parts of the main semiconductor device element 11 having the same impurity concentration and depth are formed concurrently.

Figure 7:
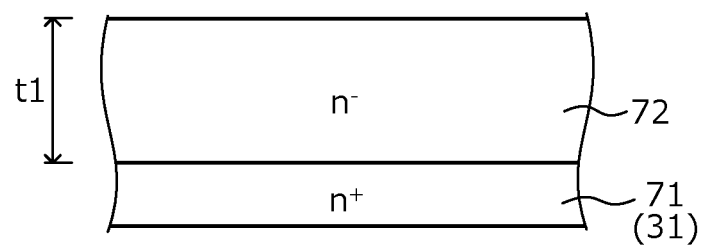
FIG. 7 is a cross-sectional view of a state of the semiconductor device according to the first embodiment during manufacture.

First, as depicted in FIG. 7, as the n$^+$-type starting substrate (semiconductor wafer) 71 containing silicon carbide, for example, a silicon carbide single crystal substrate doped with nitrogen (N) is prepared. The front surface of the n$^+$-type starting substrate 71, for example, may be a (0001)-plane, a so-called Si-face. Next, on the front surface of the n$^+$-type starting substrate 71, the first n$^-$-type epitaxial layer 72 doped with a lower concentration of nitrogen than is the n$^+$-type starting substrate 71 is epitaxially grown. In an instance of the main semiconductor device element 11 having a breakdown voltage of 3300V, a thickness t1 of the first n$^-$-type epitaxial layer 72 may be, for example, about 30 µm.

Figure 8:
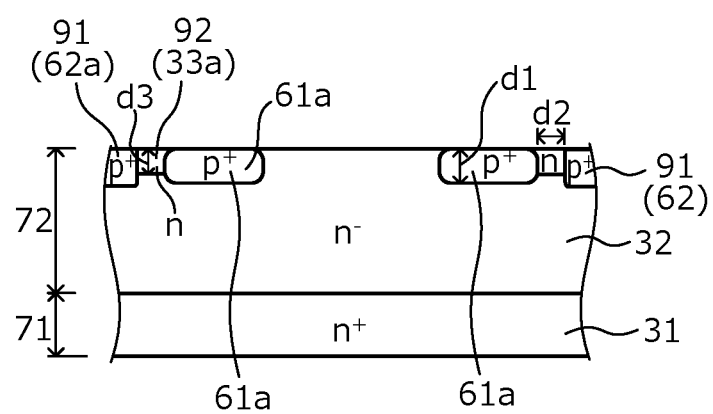
FIG. 8 is a cross-sectional view of a state of the semiconductor device according to the first embodiment during manufacture.

Next, as depicted in FIG. 8, by photolithography and, for example, ion implantation of a p-type impurity such as Al, in surface regions of the first n$^-$-type epitaxial layer 72, the first p$^+$-type regions 61a and p$^+$-type regions 91 are selectively formed. The first p$^+$-type regions 61a are formed at borders between the main MOS regions 15a and the main SBD regions 16a of the main effective region 1a (refer to FIGS. 3 and 4). The p$^+$-type regions 91 are formed in the main MOS regions 15a of the main effective region 1a. In the main SBD regions 16a, between the first p$^+$-type regions 61a adjacent to one another, the first n$^-$-type epitaxial layer 72 is left as is at the time epitaxial growth without ion implantation being performed therein.

Next, by photolithography and, for example, ion implantation of an n-type impurity such as nitrogen, n-type regions 92 are formed in surface regions of the first n$^-$-type epitaxial layer 72. In the main MOS regions 15a of the main effective region 1a, the n-type regions 92 are formed between the first p$^+$-type regions 61a and the p$^+$-type regions 91, in contact with these regions. During this ion implantation as well, in the main SBD regions 16a, between the first p$^+$-type regions 61a adjacent to one another, the first n$^-$-type epitaxial layer 72 is left as is at the time of epitaxial growth without ion implantation being performed therein. A sequence in which the n-type regions 92 and the p$^+$-type regions 61a, 91 are formed may be interchanged.

A distance d2 between the p$^+$-type regions 61a, 91 adjacent to one another is, for example, about 1.5 µm. The p$^+$-type regions 61a, 91 have, for example, a depth d1 of about 0.5 µm and an impurity concentration of about 5.0×10$^{18}$/cm$^3$. The n-type regions 92 have, for example, a depth d3 of about 0.4 µm and an impurity concentration of about 1.0×10$^{17}$/cm$^3$. Portions of the first n$^-$-type epitaxial layer 72 free of ion implantation constitute the n$^-$-type drift region 32. In the main SBD regions 16a, between the first p$^+$-type regions 61a adjacent to one another, the n$^-$-type drift region 32 is exposed at an epitaxial layer surface.

Figure 9:
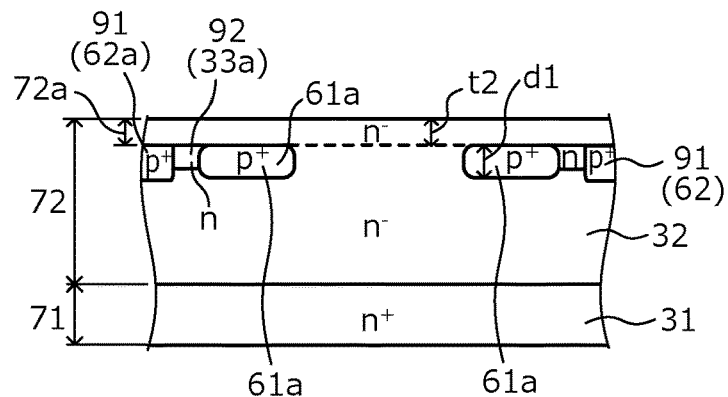
FIG. 9 is a cross-sectional view of a state of the semiconductor device according to the first embodiment during manufacture.

Next, as depicted in FIG. 9, on the first n$^-$-type epitaxial layer 72, for example, an n$^-$-type epitaxial layer doped with an n-type impurity such as nitrogen is further epitaxially grown having, for example, a thickness t2 of about 0.5 µm so that the first n$^-$-type epitaxial layer 72 has a predetermined thickness. An impurity concentration of a portion 72a that increases the thickness of the first n$^-$-type epitaxial layer 72 may be, for example, 3×10$^{15}$/cm$^3$. In the main SBD regions 16a, portions of the n$^-$-type drift region 32 between the first p$^+$-type regions 61a adjacent to one another are connected to the portion 72a that increases the thickness of the first n$^-$-type epitaxial layer 72 by portions facing thereto in the depth direction Z (n$^-$-type regions: dashed-line portions).

Figure 10:
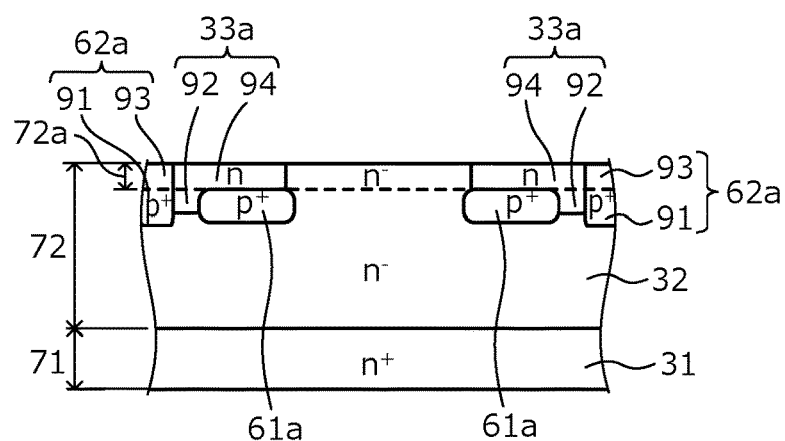
FIG. 10 is a cross-sectional view of a state of the semiconductor device according to the first embodiment during manufacture.

Next, as depicted in FIG. 10, by photolithography and ion implantation of a p-type impurity such as Al, p$^+$-type regions 93 reaching the p$^+$-type regions 91 are selectively formed in the portion 72a that increases the thickness of the first n$^-$-type epitaxial layer 72. Next, by photolithography and, for example, ion implantation of an n-type impurity such as nitrogen, n-type regions 94 reaching the n-type regions 92 and the first p$^+$-type regions 61a are selectively formed in the portion 72a that increases the thickness of the first n$^-$-type epitaxial layer 72. In the main SBD regions 16a, between the n-type regions 94 adjacent to one another, the first n$^-$-type epitaxial layer 72 is left as is at the time of epitaxial growth without ion implantation being performed therein.

As a result, the p$^+$-type regions 91, 93 adjacent to each other in the depth direction Z are connected, whereby the second p$^+$-type regions 62a are formed. The n-type regions 92, 94 adjacent to each other in the depth direction Z are connected, whereby the n-type current spreading regions 33a are formed. The n-type regions 94, for example, are formed so as to overlap formation regions of the trenches 37a to an extent of not protruding toward centers of the main SBD regions 16a, from ends of the first p$^+$-type regions 61a, the ends thereof in the main SBD regions 16a. Conditions such as impurity concentrations of the p$^+$-type regions 93 and the n-type regions 94, for example, are respectively the same as those of the p$^+$-type regions 91 and the n-type regions 92. A sequence in which the p$^+$-type regions 93 and the n-type regions 94 are formed may be interchanged.

Figure 11:
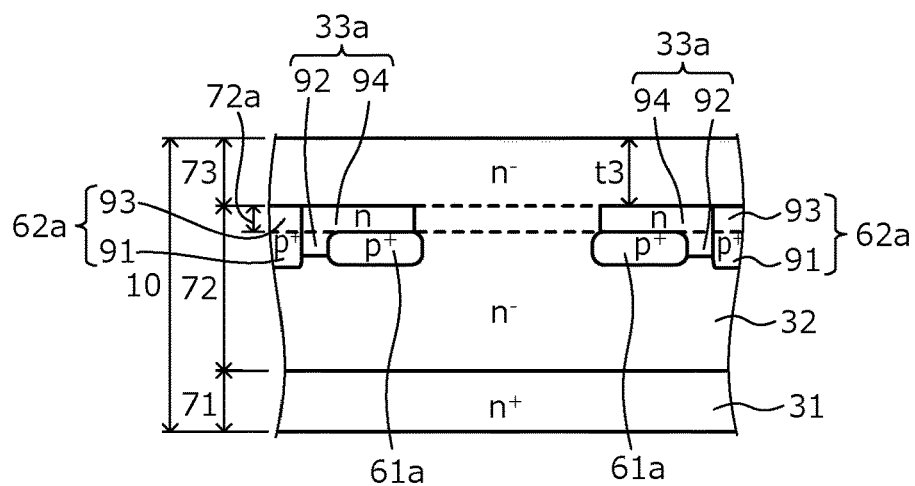
FIG. 11 is a cross-sectional view of a state of the semiconductor device according to the first embodiment during manufacture.

Next, as depicted in FIG. 11, on the first n$^-$-type epitaxial layer 72, for example, the second n$^-$-type epitaxial layer 73 doped with an n-type impurity such as nitrogen is epitaxially grown. The second n$^-$-type epitaxial layer 73 has, for example, a thickness t3 of at most about 1.1 µm and an impurity concentration of about 4.0×10$^{17}$/cm$^3$. The thickness t3 of the second n$^-$-type epitaxial layer 73 is thin as compared to an instance in which, for example, like the conventional structure (refer to FIG. 26), the p-type epitaxial layer 273 constituting the p-type base region 234 is epitaxially grown on the n$^-$-type epitaxial layer 272 constituting the n$^-$-type drift region 232.

A reason for this is as follows. In the conventional structure, at the time point when the p-type epitaxial layer 273 constituting the p-type base region 234 is epitaxial grown, the p-type base region 234 and the second p$^+$-type regions 262 formed in the n$^-$-type epitaxial layer 272 by ion implantation are in contact with each other in the depth direction Z. On the other hand, in the first embodiment, when the thickness t3 of the second n$^-$-type epitaxial layer 73 is too thick, as described hereinafter, the p-type base regions 34a formed in the second n$^-$-type epitaxial layer 73 by ion implantation are not deep enough to penetrate through the second n$^-$-type epitaxial layer 73.

In this case, the p-type base regions 34a and the second p$^+$-type regions 62a are disconnected by an n$^-$-type region (the n$^-$-type drift region 32) left between the p-type base regions 34a and the second p$^+$-type regions 62a in the first n$^-$-type epitaxial layer 72. Therefore, the thickness t3 of the second n$^-$-type epitaxial layer 73 has to be reduced to an extent that formation of the p-type base regions 34a is possible by ion implantation of a depth penetrating through the second n⁻-type epitaxial layer 73 and preferably, may be in a range from a necessary thickness for a channel (n-type inversion layer) (for example, about 0.5 μm) to 0.8 μm.

By the processes up to here, the semiconductor substrate 10 (semiconductor wafer) of an n-type and in which only the first and the second n⁻-type epitaxial layers 72, 73 are sequentially stacked on the n⁺-type starting substrate 71 is fabricated. As described above, the portions of the first n⁻-type epitaxial layer 72 free of ion implantation constitute the n⁻-type drift region 32 and in the main SBD regions 16a, the n⁻-type drift region 32 is exposed at the epitaxial layer surface, between the n-type regions 94 adjacent to one another. In the main SBD regions 16a, portions of the n⁻-type drift region 32 between the n-type regions 94 adjacent to one another are connected to the second n⁻-type epitaxial layer 73 by portions facing thereto in the depth direction Z (n⁻-type regions: dashed-line portions).

Figure 12:
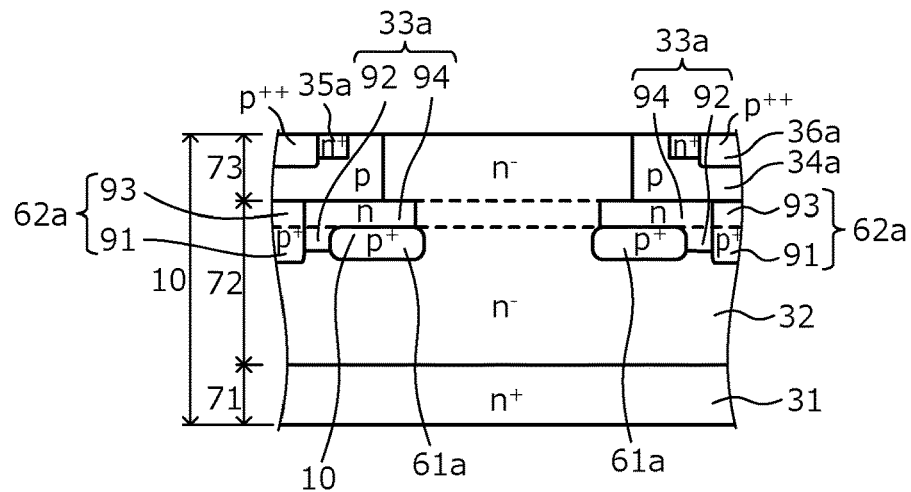
FIG. 12 is a cross-sectional view of a state of the semiconductor device according to the first embodiment during manufacture.

Next, as depicted in FIG. 12, a process including photolithography and ion implantation as one set is performed repeatedly under different conditions, selectively forming, in the main MOS regions 15a, the p-type base regions 34a, the n⁺-type source regions 35a, and the p⁺⁺-type contact regions 36a in surface regions of the second n⁻-type epitaxial layer 73. The p-type base regions 34a have a range that is a depth of, for example, about 0.5 μm from the surface of the second n⁻-type epitaxial layer 73 (the front surface of the semiconductor substrate 10) and are formed having a thickness that reaches, for example, about 0.4 μm to 0.5 μm toward each of the main surfaces of the semiconductor substrate 10, from the depth of the range, the p-type base regions 34a being connected to the second p⁺-type regions 62a.

The p-type base regions 34a and the n⁺-type source regions 35a, for example, are formed overlapping formation regions of the trenches 37a to an extent of not protruding toward the centers of the main SBD regions 16a, from the formation regions of the trenches 37a. As a result, the p-type base regions 34a and the n⁺-type source regions 35a may assuredly be in contact with the gate insulating films 38a at sidewalls of the trenches 37a, the sidewalls thereof in the main MOS regions 15a, and the gate insulating films 38a being formed by a subsequent process. In addition to this, formation of the p-type base regions 34a and the n⁺-type source regions 35a in the main SBD regions 16a may be prevented.

In the main SBD regions 16a, between the p-type base regions 34a adjacent to one another, the second n⁻-type epitaxial layer 73 is left as is at the time of epitaxial growth without ion implantation being performed therein. Portions of the second n⁻-type epitaxial layer 73 free of ion implantation constitute the n⁻-type drift region 32. In the main SBD regions 16a, between the p-type base regions 34a adjacent to one another, the n⁻-type drift region 32 is exposed at the epitaxial layer surface (the front surface of the semiconductor substrate 10). In the main SBD regions 16a, the n⁻-type drift region 32 constituted by the first and the second n⁻-type epitaxial layers 72, 73 is disposed between the front surface of the semiconductor substrate 10 and the n⁺-type starting substrate 71.

Figure 13:
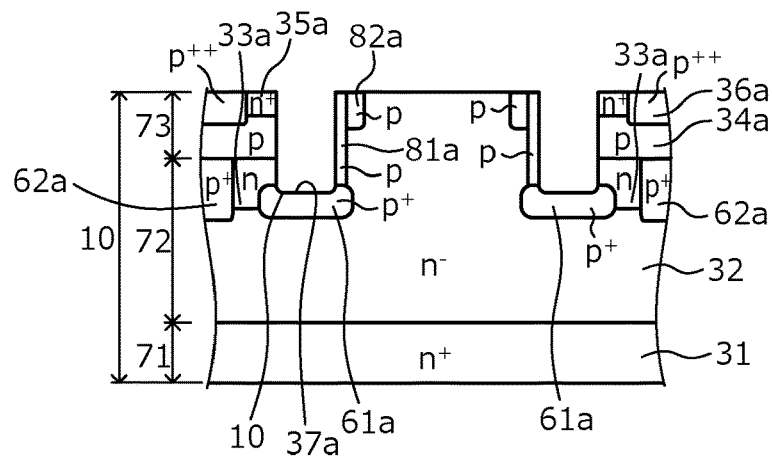
FIG. 13 is a cross-sectional view of a state of the semiconductor device according to the first embodiment during manufacture.

Next, as depicted in FIG. 13, the trenches 37a penetrating through the n⁺-type source regions 35a, the p-type base regions 34a, and the n-type current spreading regions 33a from the front surface of the semiconductor substrate 10 and reaching the first p⁺-type regions 61a are formed by photolithography and etching. Next, an etching mask used in forming the trenches 37a is used as a mask and from an oblique direction with respect to the SBD-sidewalls of the trenches 37a, a p-type impurity such as Al is ion implanted into the SBD-sidewalls of the trenches 37a. By this ion implantation, the first p-type regions 81a are formed in an entire area of the SBD-sidewalls of the trenches 37a.

Next, the etching mask used in forming the trenches 37a is used as a mask and from an oblique direction with respect to the SBD-sidewalls of the trenches 37a, a p-type impurity such as Al is ion implanted into the SBD-sidewalls of the trenches 37a. By this ion implantation, the second p-type regions 82a are formed at positions further from the SBD-sidewalls of the trenches 37a than are the first p-type regions 81a. A sequence in which the first and the second p-type regions 81a, 82a are formed may be interchanged. Before formation of the trenches 37a, the first and the second p-type regions 81a, 82a may be formed by ion implantation from a direction orthogonal to the front surface of the semiconductor substrate 10.

Next, activation of all diffused regions (the first and the second p⁺-type regions 61a, 62a, the n-type current spreading regions 33a, the p-type base regions 34a, the n⁺-type source regions 35a, the p⁺⁺-type contact regions 36a, and the first and the second p-type regions 81a, 82a) formed by ion implantation, for example, is performed by a heat treatment (activation annealing) at a temperature of about 1700 degrees C. for about 2 minutes. The activation annealing may be performed once for all of the diffused regions collectively after formation thereof or may be performed each time diffused regions are formed by ion implantation. In an instance in which the first and the second p-type regions 81a, 82a are formed before the formation of the trenches 37a, the activation annealing may be performed after the formation of all of the diffused regions but before the formation of the trenches 37a.

Figure 14:
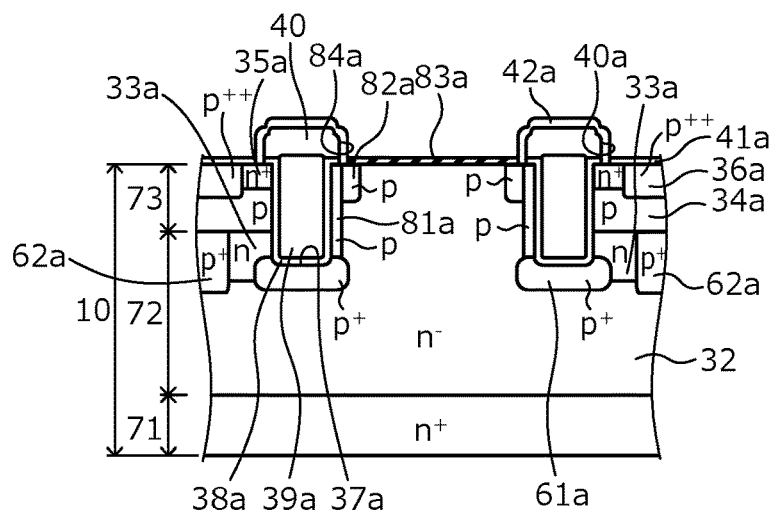
FIG. 14 is a cross-sectional view of a state of the semiconductor device according to the first embodiment during manufacture.

Next, as depicted in FIG. 14, the gate insulating films 38a are formed along the front surface of the semiconductor substrate 10 and inner walls of the trenches 37a. The gate insulating films 38a, for example, may be a thermally oxidized film formed by thermally oxidizing a semiconductor surface by temperature of about 1000 degrees C. under an oxygen ($O_2$) atmosphere or may be a film deposited by high temperature oxidation such as that for a high temperature oxide (HTO). Next, a polysilicon film doped with, for example, phosphorus (P) is deposited (formed) on the front surface of the semiconductor substrate 10 so as to be embedded in the trenches 37a and is selectively removed, leaving portions thereof constituting the gate electrodes 39a in the trenches 37a.

Further, as described above, the parts of the other semiconductor device elements fabricated on the same semiconductor substrate 10 and the parts of the main semiconductor device element 11 having the same impurity concentration and/or depth are formed concurrently with each other. The main semiconductor device element 11 is disposed in the p-type base regions 34a, which have an island-like shape and are formed in surface regions of the semiconductor substrate 10, at the front surface of the semiconductor substrate 10, whereby the main semiconductor device element 11 is isolated from the other semiconductor device elements fabricated on the same semiconductor substrate 10, by pn junction isolation between the p-type base regions 34a and the n⁻-type drift region 32. The current sensing portion 12 may have a structure similar to that of the main semiconductor device element 11 and may be disposed in the p-type base regions 34b, which have an island-like shape and are formed in surface regions of the semiconductor substrate 10, at the front surface of the semiconductor substrate 10.

Next, the interlayer insulating film 40 containing, for example, borophosphosilicate glass (BPSG), PSG, etc. and having a thickness of, for example, 1 µm is formed in an entire area of the front surface of the semiconductor substrate 10 so as to cover the gate electrodes 39a. Next, by photolithography and etching, the first to the sixth contact holes 40a, 84a, 40b, 84b, 84c, 40c that penetrate through the interlayer insulating film 40 and the film constituting the gate insulating films 38a in the depth direction Z are formed. In the first contact holes 40a, the $n^+$-type source regions 35a and the $p^{++}$-type contact regions 36a of the main MOS regions 15a are exposed.

In the second contact holes 84a, the second p-type regions 82a and the $n^-$-type drift region 32 of the main SBD regions 16a are exposed. In the third contact holes 40b, the $n^+$-type source regions 35b and the $p^{++}$-type contact regions 36b of the sensing MOS regions 15b are exposed. In the fourth contact holes 84b, the second p-type regions 82b and the $n^-$-type drift region 32 of the first sensing SBD regions 16b are exposed. In the fifth contact hole 84c, the second p-type regions 82c and the $n^-$-type drift region 32 of the second sensing SBD region 18 are exposed. In the sixth contact hole 40c, the p-type base region 34b of the third sensing region 19 is exposed.

Next, by a heat treatment, the interlayer insulating film 40 is planarized (reflow). Next, the first TiN film 42a covering only the interlayer insulating film 40 is formed. Next, the NiSi films 41a are formed in portions of the front surface of the semiconductor substrate 10 exposed in the first contact holes 40a, and the Schottky electrodes 83a are formed in portions of the front surface of the semiconductor substrate 10 exposed in the second contact holes 84a. The Schottky electrodes 83a are, for example, a Ti film. Next, the first Ti film 43a, the second TiN film 44a, and the second Ti film 45a are sequentially stacked so as to cover the NiSi films 41a, the Schottky electrodes 83a, and the first TiN film 42a, whereby the barrier metal 46a is formed. Next, the source pad 21a is deposited on the second Ti film 45a.

In the third and the sixth contact holes 40b, 40c as well, the NiSi films 41b are formed concurrently with the NiSi films 41a. In the fourth and the fifth contact holes 84b, 84c as well, the Schottky electrodes 83b, 83c are formed concurrently with the Schottky electrodes 83a. In the third to the sixth contact holes 40b, 84b, 84c, 40c, the barrier metal 46b is formed concurrently with the barrier metal 46a. The gate pad 21b, the OC pad 22, the anode pad 23a, and the cathode pad 23b are formed concurrently with the source pad 21a. On the back surface of the semiconductor substrate 10, the drain electrode 51 is formed and on a surface of the drain electrode 51, for example, a Ti film, an Ni film, and a gold (Au) film are sequentially stacked, thereby forming the drain pad (not depicted).

Next, the first protective films 49a, 49b containing a polyimide are selectively formed on the front surface of the semiconductor substrate 10, and the source pad 21a and the OC pad 22 are exposed, respectively, in openings of the first protective films 49a, 49b. Next, after a general plating pretreatment process, the plating films 47a, 47b are formed by a general plating process, respectively, in respective portions of the source pad 21a and the OC pad 22 exposed, respectively, in openings of the first protective films 49a, 49b. Next, the plating films 47a, 47b are dried by a heat treatment (baking). Next, the second protective films 50a, 50b containing a polyimide are formed, covering borders between the plating films 47a, 47b and the first protective films 49a, 49b.

Next, the strength of a polyimide film (the first protective films 49a, 49b and the second protective films 50a, 50b) is enhanced by a heat treatment (curing). Next, on the plating films 47a, 47b, the terminal pins 48a, 48b are respectively bonded by a solder layer. On the other electrode pads as well such as the gate pad 21b, the anode pad 23a, and the cathode pad 23b, concurrently with the wiring structure on the source pad 21a, a first protective film, a plating film, and a second protective film are sequentially formed, whereby a wiring structure to which terminal pins are bonded by a solder layer is formed. Thereafter, the semiconductor substrate 10 (semiconductor wafer) is diced (cut) into individual chips, whereby the semiconductor device 20 depicted in FIGS. 1 to 4 is completed.

As described above, according to the first embodiment, in the main semiconductor device element, in main MOS regions responsible for MOSFET driving, a normal trench gate structure is disposed and in the main SBD regions disposed adjacent to the main MOS regions, the $n^-$-type drift region extends to the front surface of the semiconductor substrate, free of the trench gate structure, and Schottky electrodes forming Schottky junctions with the $n^-$-type drift region are disposed. Further, the ohmic electrodes of the main MOS regions and the Schottky electrodes of the main SBD regions are electrically connected by the source electrode, whereby the SBDs of the main SBD regions are connected in antiparallel to the MOSFETs of the main MOS regions.

The SBDs of the main SBD regions are connected in antiparallel to the MOSFETs of the main MOS regions, whereby when the MOSFETs are OFF, before current flows through the parasitic diodes of the MOSFETs, forward current may flow to the SBDs for which forward voltage is lower than that for the parasitic diodes. As a result, degradation over time due to parasitic diode operation may be prevented. For example, in an instance in which the main semiconductor device element is used as MOSFETs configuring an inverter (refer to FIG. 19), the SBDs built into the main semiconductor device element may be used as freewheeling diodes and during inverter operation, the flow of reflux current to the parasitic diodes of the MOSFETs may be suppressed.

Further, according to the first embodiment, by the first and the second p-type regions provided in the main SBD regions and the first $p^+$-type regions surrounding the trench bottoms, the trenches are surrounded by p-type regions spanning the bottoms of the trenches from the sidewalls thereof in the main SBD regions. As a result, during operation of the SBDs in the main SBD regions, electric field applied to the trenches, at the bottom corner portions thereof in the main SBD regions, may be mitigated. As a result, SBD destruction resistance may be enhanced, and a reverse bias safe operating area (RBSOA) may be established in an entire area of the main semiconductor device element.

Figure 15:
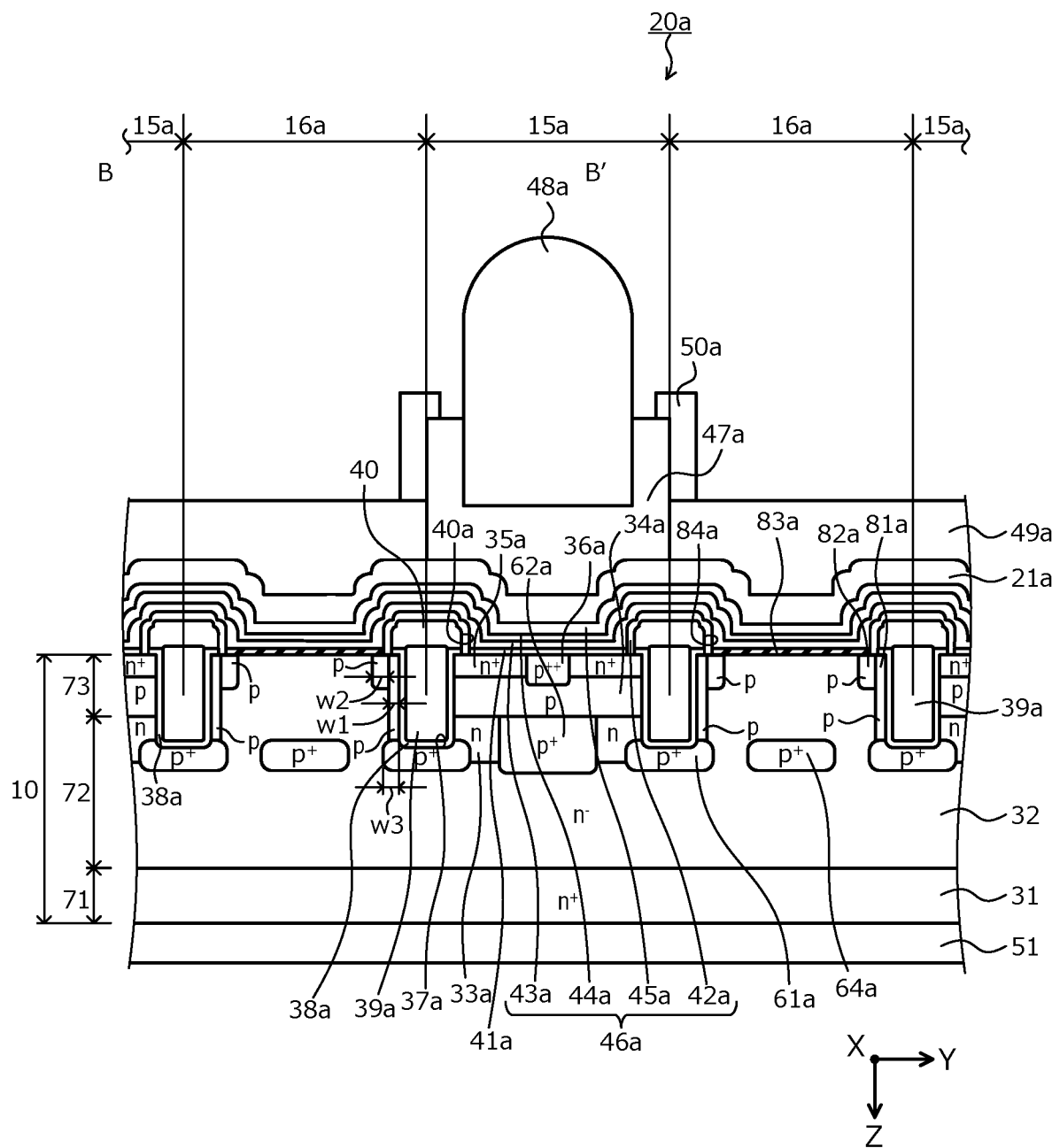
FIG. 15 is a cross-sectional view of a structure of the semiconductor device according to the second embodiment.
Figure 16:
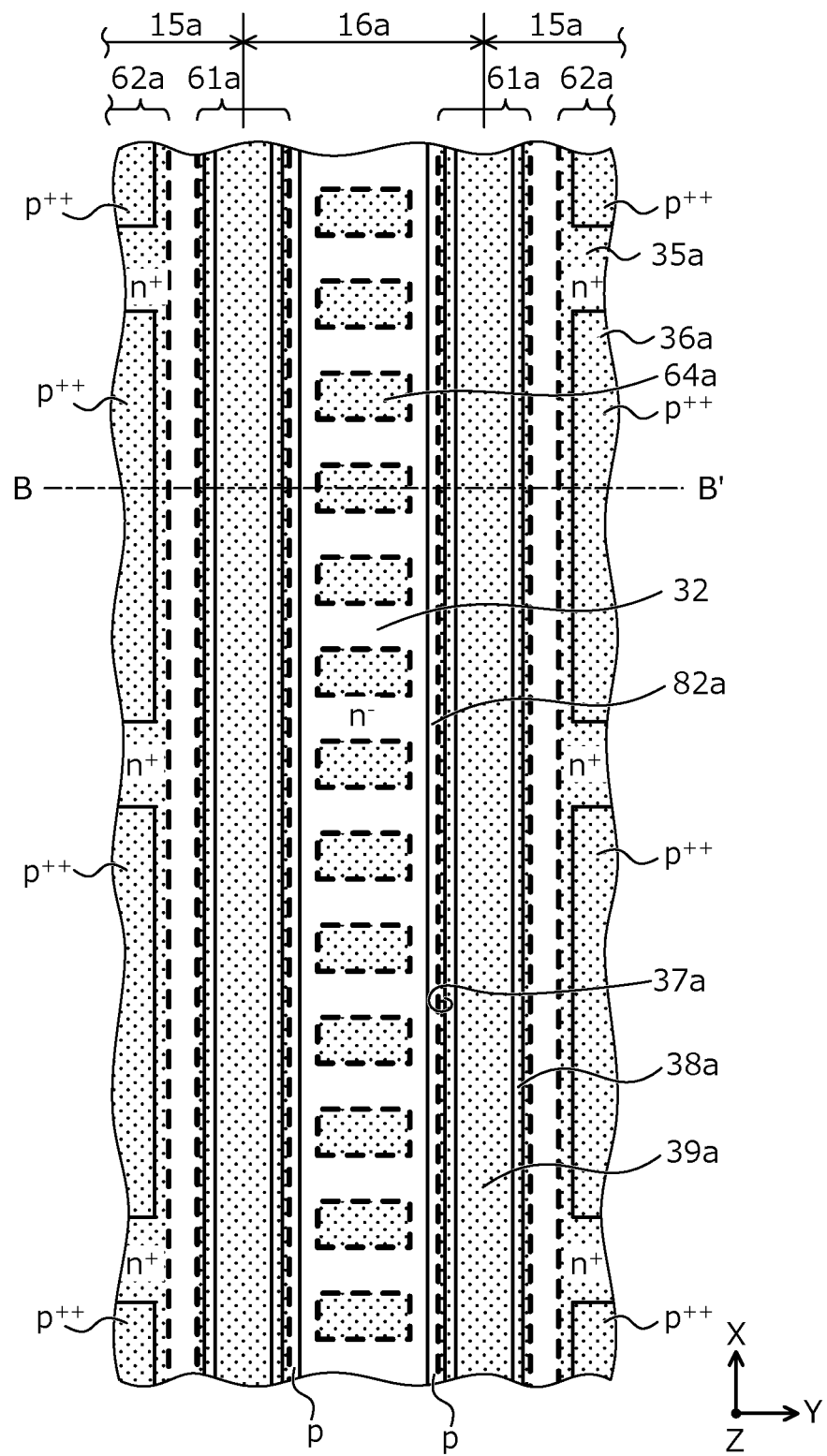
FIG. 16 is an enlarged view of a portion of the main effective region in FIG. 1.
Figure 17:
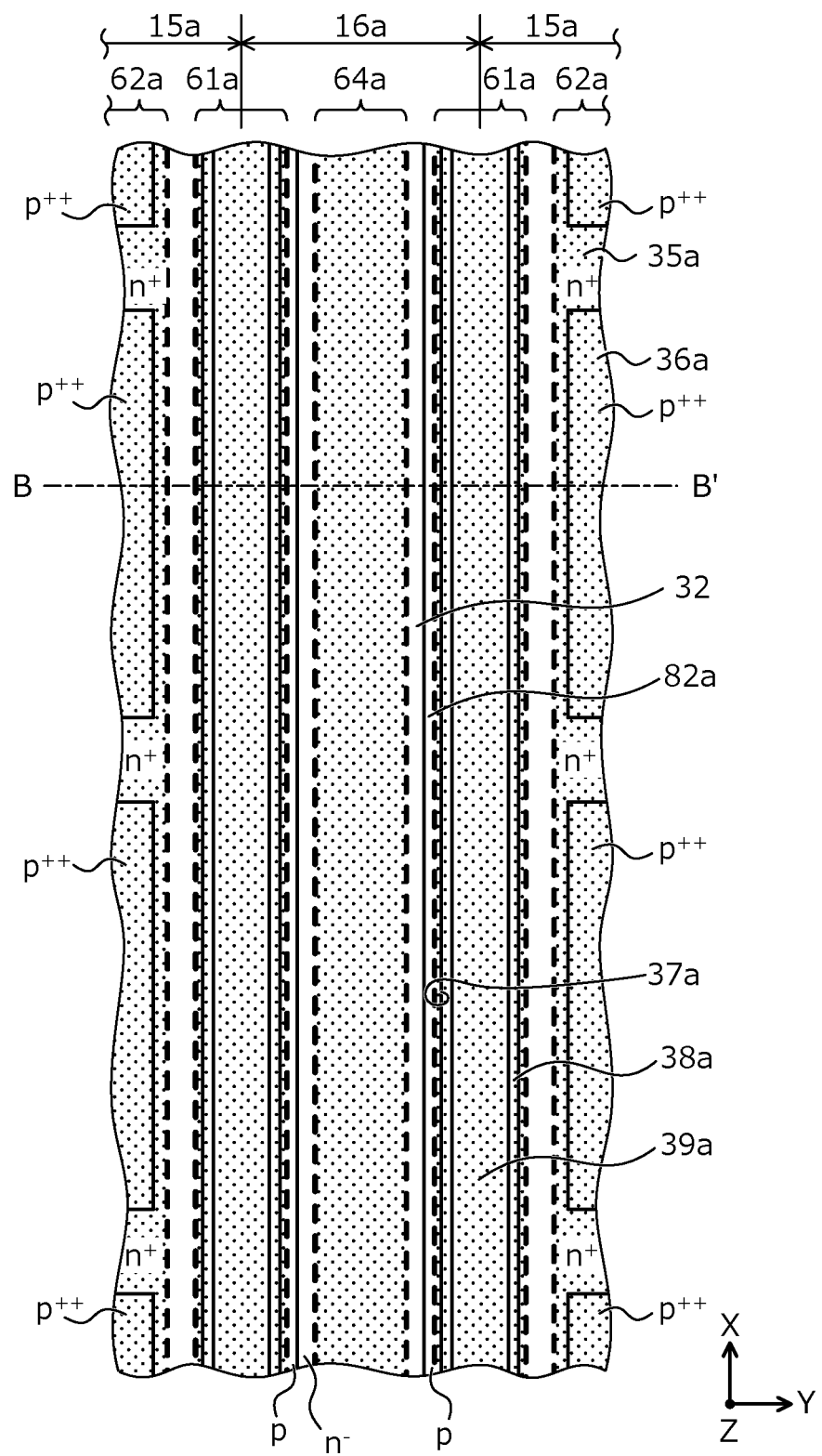
FIG. 17 is an enlarged view of a portion of the main effective region in FIG. 1.

Next, a structure of a semiconductor device according to a second embodiment is described. FIG. 15 is a cross-sectional view of a structure of the semiconductor device according to the second embodiment. FIG. 15 depicts a cross-section of the structure along cutting line B-B' in FIGS. 16 and 1. A plan layout of a semiconductor device 20a according to the second embodiment is similar to that in FIG. 1. FIGS. 16 and 17 are enlarged views of a portion of the main effective region in FIG. 1. In FIGS. 16 and 17, the $n^+$-type source regions 35a, the $p^{++}$-type contact regions 36a, and the trenches 37a, etc. are also depicted so that planar arrangement of the first to third p$^+$-type regions 61a, 62a, 64a (hatched portions between vertical dashed lines) is clear.

The semiconductor device 20a according to the second embodiment differs from the semiconductor device 20 according to the first embodiment (refer to FIG. 4) in that the third p$^+$-type regions (third high-concentration regions) 64a are selectively provided in the main SBD regions 16a, separate from the trenches 37a. The third p$^+$-type regions 64a, for example, are formed concurrently with the first p$^+$-type regions 61a, at a same depth as that of the first p$^+$-type regions 61a and have a same thickness at that of the first p$^+$-type regions 61a. By disposing the third p$^+$-type regions 64a, p$^+$-type regions (the first to the third p$^+$-type regions 61a, 62a, 64a) are disposed at even intervals in the second direction Y between all of the trenches 37a adjacent to one another in the main effective region 1a.

The third p$^+$-type regions 64a may be provided in the main SBD regions 16a, scattered in the first direction X between the trenches 37a adjacent to one another (FIG. 16), or may extend in a linear shape in the first direction X (FIG. 17). The third p$^+$-type regions 64a may have a floating potential or may be fixed to the potential of the source pad 21a by being connected to the first p$^+$-type regions 61a that are fixed to the potential of the source pad 21a (not depicted). In an instance in which the third p$^+$-type regions 64a are fixed to the potential of the source pad 21a, the SBD function of the main SBD regions 16a may be partially suppressed by places where the third p$^+$-type regions 64a are connected to the first p$^+$-type regions 61a.

In the current sensing portion 12 (refer to FIG. 3), the first sensing SBD regions 16b or the second sensing SBD region 18, or both, may be provided with p$^+$-type regions having a configuration similar to that of the third p$^+$-type regions 64a of the main semiconductor device element 11.

As described above, according to the second embodiment, effects similar to those of the first embodiment may be obtained. Further, according to the second embodiment, the third p$^+$-type regions are provided in the main SBD regions, whereby current at least 3 times a rated current, a high-voltage region, and further improvement of the destruction resistance in a high-frequency region are possible.

Figure 18:
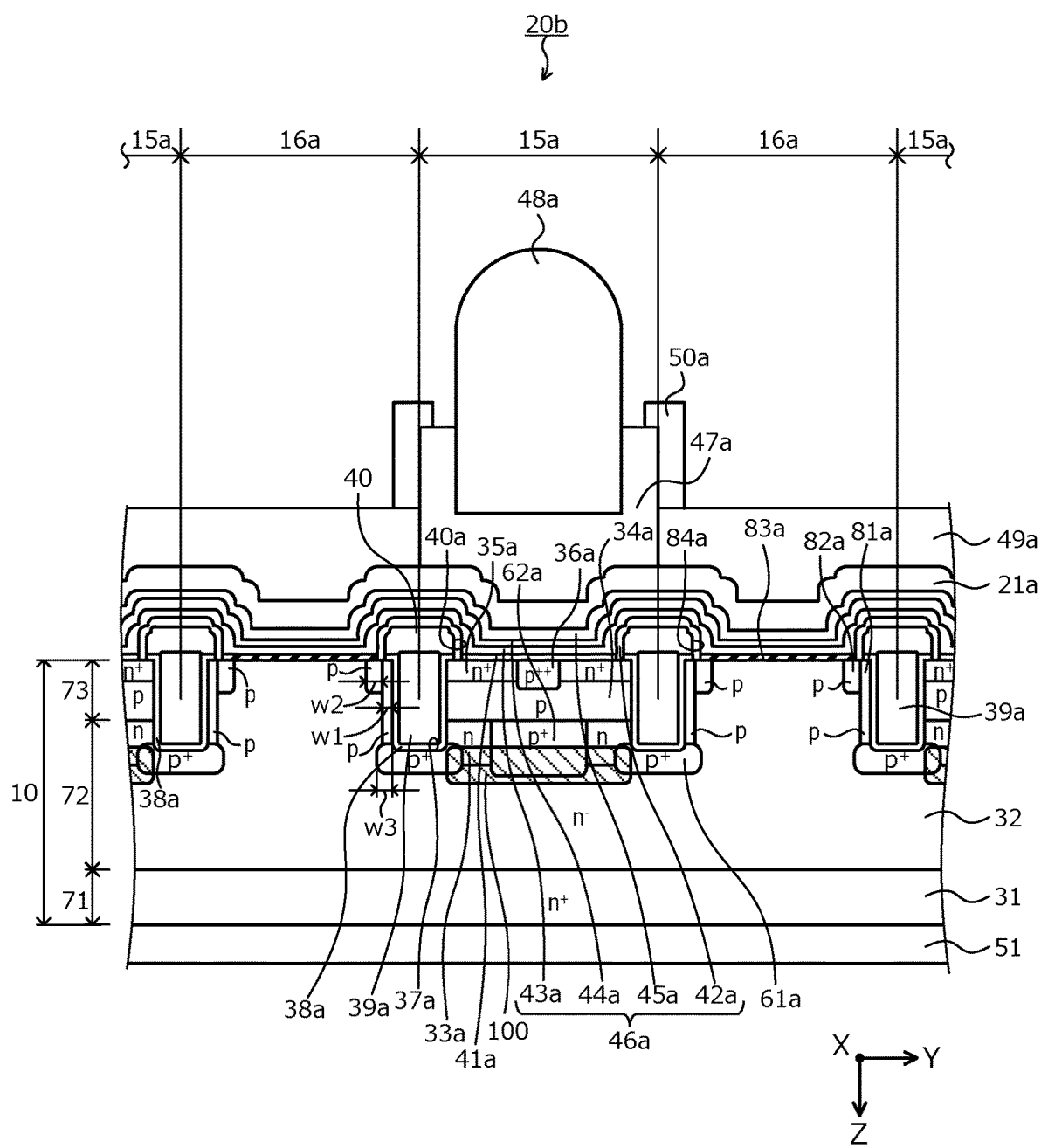
FIG. 18 is a cross-sectional view of a structure of a semiconductor device according to a third embodiment.

Next, a structure of a semiconductor device according to a third embodiment is described. FIG. 18 is a cross-sectional view of a structure of the semiconductor device according to the third embodiment. FIG. 18 depicts a portion of the main effective region 1a in FIG. 1. The semiconductor device 20b according to the third embodiment differs from the semiconductor device 20 according to the first embodiment (refer to FIG. 4) in that in the main MOS regions 15a, lifetime killer regions 100 in which the lifetime of minority carriers (electrons) is shorter than that of other regions (is the shortest). The lifetime killer regions 100 contains, for example, helium (He) or platinum (Pt) as lifetime killers (point defects that become recombination centers).

The lifetime killer regions 100 are provided in an entire area of the second p$^+$-type regions 62a and the n-type current spreading regions 33a in the main MOS regions 15a, between the trenches 37a adjacent to one another, the lifetime killer regions 100 being provided at a depth position closer to the n$^+$-type drain region 31 than are the bottoms of the trenches 37a. The lifetime killer regions 100 may extend in the second direction Y so as to overlap portions of the first p$^+$-type regions 61a, the portions thereof in the main MOS regions 15a. The lifetime killer regions 100 may extend in the depth direction Z into the n$^-$-type drift region 32 or may be provided in an entire area of the n$^-$-type drift region 32 in the main MOS regions 15a. By providing the lifetime killer regions 100, the flow of current in the parasitic diodes formed in the main MOS regions 15a may be assuredly suppressed.

The lifetime killer regions 100 are formed by, for example, performing lifetime killer irradiation from the front surface or the back surface of the semiconductor substrate 10 after the formation the source pad 21a and the drain electrode 51 but before the formation of the drain pad, and by further performing the lifetime killer irradiation after the formation of the second protective films 50a but before the soldering of the terminal pins 48a. Each time the lifetime killer irradiation is performed, a diffusion heat treatment for diffusing the lifetime killers is performed. In the main semiconductor device element 11, the SBDs are built-in, whereby leak current increases. Therefore, depending on design conditions, this diffusion heat treatment may be omitted.

Figure 19:
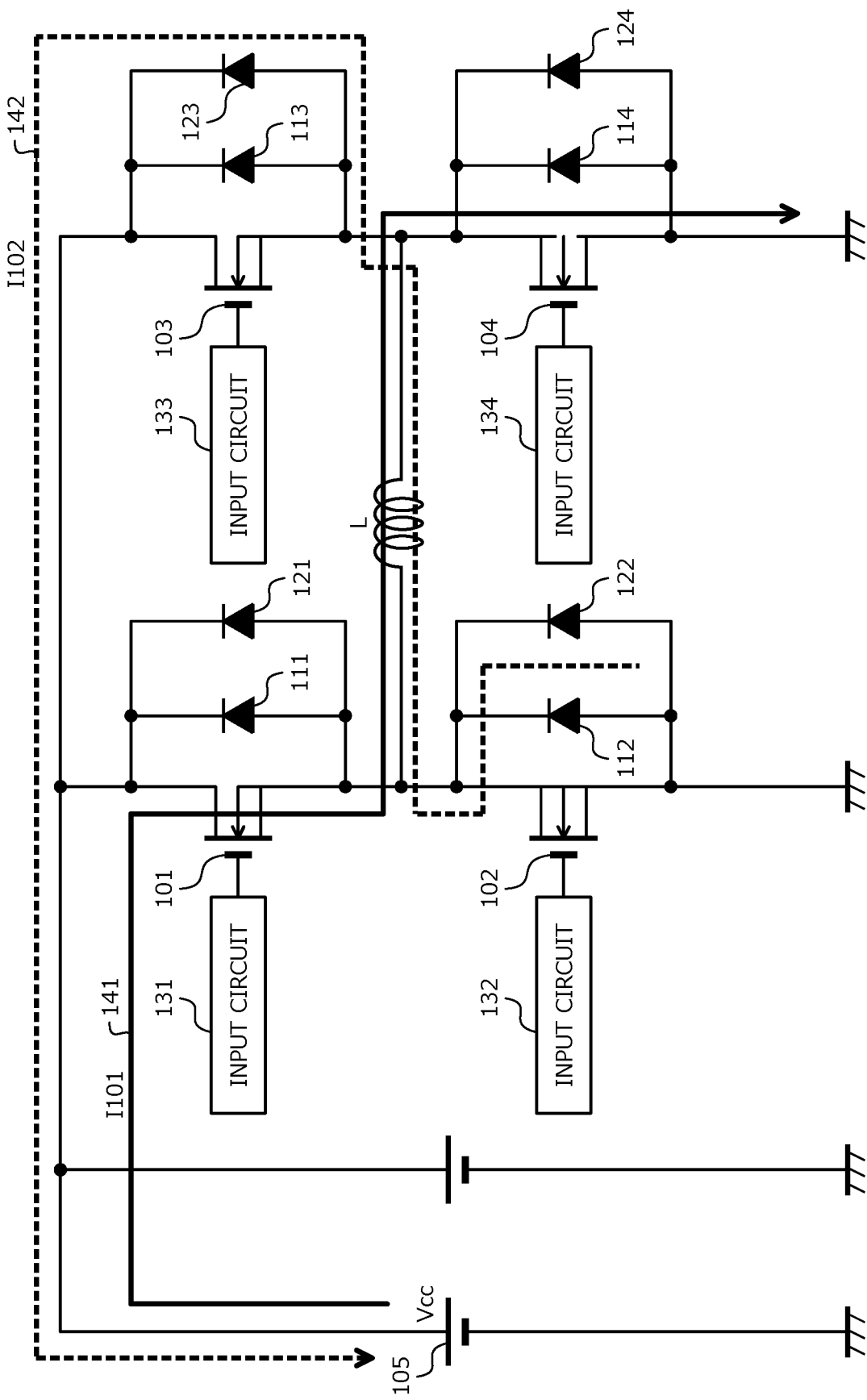
FIG. 19 is a circuit diagram depicting circuit configuration of a general semiconductor circuit device.

The MOSFETs of the main MOS regions 15a of the main semiconductor device element 11 may be used as MOSFETs 101, 102, 103, 104 configuring a later-described inverter in FIG. 19. A semiconductor circuit device that performs inverter operation by passing current through an inductive load by turning the MOSFETs ON/OFF. FIG. 19 is a circuit diagram depicting circuit configuration of a general semiconductor circuit device. In FIG. 19, a 2-phase portion of the circuit configuration of a 3-phase inverter is not depicted. The semiconductor circuit device depicted in FIG. 19 is an inverter having a full bridge circuit configuration that converts direct current voltage into alternating current voltage by the ON/OFF operation of the four MOSFETs 101 to 104.

Drains of the MOSFETs 101, 103 on a high-side (power-supply-line-side) are connected to a positive-electrode-side of a direct current power supply 105. Sources of the MOSFETs 101, 103 on the high-side are connected to drains of the MOSFETs 102, 104 on a low-side (ground-side), respectively. Sources of the MOSFETs 102, 104 on the low-side and a negative-electrode-side of the direct current power supply 105 are grounded. Between the source of the MOSFET 101 and the drain of the MOSFET 102 and the source of the MOSFET 103 and the drain of the MOSFET 104, an inductive load L having an inductance component is connected.

Parasitic diodes 111, 112, 113, and 114 formed by pn junctions between p-type base regions and an n$^-$-type drift region are built in the MOSFETs 101 to 104, respectively. Further, SBDs 121, 122, 123, and 124 are connected in antiparallel to the MOSFETs 101 to 104, respectively. The MOSFETs 101 to 104 correspond to the MOSFETs of the main MOS regions 15a (refer to FIG. 18). The SBDs 121 to 124 correspond to the SBDs of the main SBD regions 16a (refer to FIG. 18). Input circuits 131 to 134 that input gate voltage to the MOSFETs 101 to 104 are connected to the gates of the MOSFETs 101 to 104, respectively.

In the inverter depicted in FIG. 19, the MOSFET 101 and the MOSFET 104 are disposed diagonally to each other and by alternately energizing the MOSFET 101 and the MOSFET 104 with the MOSFET 102 and the MOSFET 103, an output of voltage with variable pulse width (pulse during ON state) is suppressed. During energization of the MOSFET 101 and the MOSFET 104, as indicated by a solid-line arrow, a current 1101 flows to the inductive load L by a path 141 from the positive-electrode-side of the direct current power supply 105, through the MOSFET 101, the inductive load L, and the MOSFET 104, to the low-side.

When the current 1101 flows to the inductive load L by the path 141 and the MOSFETs 101, 104 turn OFF, to continuously pass the current of the inductive load L, and freewheeling diodes of the MOSFETs 102, 103 are energized in the forward direction, thereby commutating the current that passes through the inductive load L. At this time, as the freewheeling diodes, when the parasitic diodes 112, 113 of the MOSFETs 102, 103 are energized in the forward direction, crystalline defects are generated in the semiconductor substrate of the MOSFETs 102, 103 due to recombination of the minority carriers (positive holes) injected from the p-type base regions to the n$^-$-type drift region of the MOSFETs 102, 103.

To prevent the generation of the crystalline defects in semiconductor substrate, the SBDs 122, 123 are connected in antiparallel as the freewheeling diodes of the MOSFETs 102, 103. Therefore, the current passing through the inductive load L, as indicated by a dashed-line arrow, is a current 1102 passed through the SBDs 122, 123 by a path 142 through the SBD 122 connected to the MOSFET 102 in the OFF state, the inductive load L, and the SBD 123 connected to the MOSFET 103 in the OFF state, to the positive-electrode-side of the direct current power supply 105. As a result, energy of the inductive load L is regenerated.

While not depicted, when the MOSFET 102 and the MOSFET 103 are energized, current passes through the inductive load L, from the positive-electrode-side of the direct current power supply 105, through the MOSFET 103, the inductive load L, and the MOSFET 102, to the low-side. The current that flows to the inductive load L passes through the SBD 124 connected to the MOSFET 104 in the OFF state, the inductive load L, and the SBD 121 connected to the MOSFET 101 in the OFF state, to the positive-electrode-side of the direct current power supply 105, whereby the energy of the inductive load L is regenerated.

Figure 20:
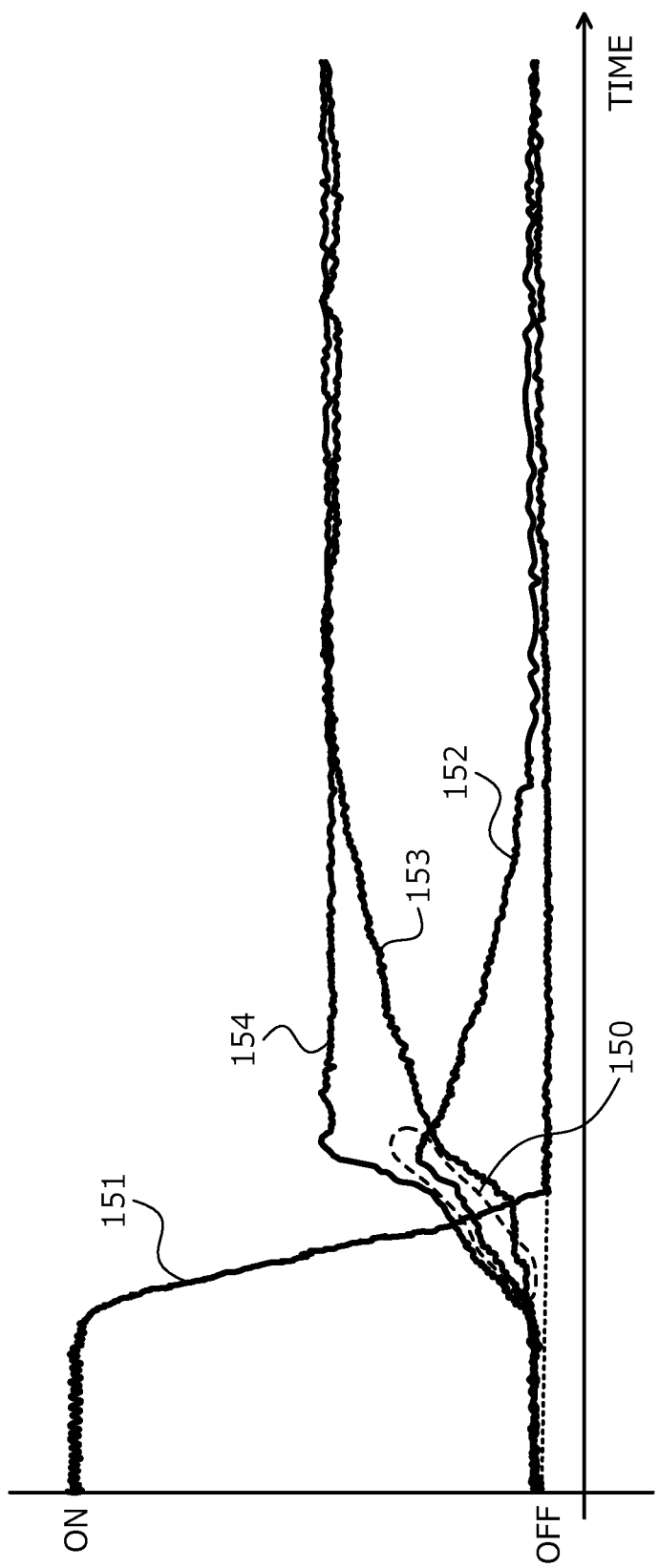
FIG. 20 is a characteristics diagram depicting current waveforms of transient currents respectively passing through SBDs through which reflux current passes when the inverter is caused to perform commutation operation and parasitic diodes of the MOSFETs to which the SBDs are connected in antiparallel.

Further, in an instance in which the inverter is caused to perform commutation operation, at the time of transition when the MOSFETs 101, 104 are switched from ON to OFF, transient current cannot be passed only through the SBDs 121, 123 and a portion of the transient current passes through the parasitic diodes 112, 113 of the MOSFETs 102, 103. FIG. 20 is a characteristics diagram depicting current waveforms of the transient currents respectively passing through the SBDs through which reflux current passes when the inverter is caused to perform commutation operation and the parasitic diodes of the MOSFETs to which the SBDs are connected in antiparallel.

Reference numerals 151, 152, 153, and 154 in FIG. 20 are respectively current waveforms when the MOSFETs 101, 104 are switched from ON to OFF and the current passing through the inductive load L is commutated. Reference numeral 151 is the current waveform of a current that flows through the MOSFETs 101, 104 reaching a steady state from the ON state. Reference numeral 152 is the current waveform of transient current that flows through the parasitic diodes 112, 113 of the MOSFETs 102, 103. Reference numeral 153 is the current waveform of reflux current that flows through the SBDs 122, 123. Reference numeral 154 is the current waveform of transient current that flows through the SBDs 122, 123.

As described above, the SBDs 121 to 124 respectively connected in antiparallel to the MOSFETs 101 to 104 are used as freewheeling diodes, whereby the flow of reflux current through the parasitic diodes 111 to 114 of the MOSFETs 101 to 104 may be suppressed; however, when the MOSFETs 102, 103 are switched from ON to OFF, a portion of the transient current 152 may flow in the forward direction through the parasitic diodes 111, 114 of the MOSFETs 101, 104 (portion indicated by reference numeral 150). The transient currents 152, 154 are currents that flow transiently at the moment that the MOSFETs 101 to 104 are turned ON from OFF.

In the third embodiment, the lifetime killer regions 100 (refer to FIG. 18) are provided in the main MOS regions 15a, whereby forward voltage of the parasitic diodes 111 to 114 of the MOSFETs 101 to 104 may be increased. As a result, a rate at which transient current is distributed to the SBDs 121 to 124 connected in antiparallel to the parasitic diodes 111 to 114 of the MOSFETs 101 to 104 may be increased and therefore, configuration may be such that the parasitic diodes 111 to 114 of the MOSFETs 101 to 104 do not conduct.

In the sensing MOS regions 15b of the current sensing portion 12 (refer to FIG. 3), lifetime killer regions configured similarly to the lifetime killer regions 100 of the main semiconductor device element 11 may be provided. Further, the third embodiment may be applied to the second embodiment, whereby lifetime killer regions configured similarly to the lifetime killer regions 100 of the main semiconductor device element 11 of the semiconductor device 20b according to the third embodiment may be provided in the sensing MOS regions 15b of the current sensing portion 12 and/or the main MOS regions 15a of the main semiconductor device element 11 (refer to FIGS. 15 to 17) of the semiconductor device 20a according to the second embodiment.

As described above, according to the third embodiment, effects similar to those of the first embodiment may be obtained. Further, according to the third embodiment, the lifetime killer regions are provided in the main MOS regions, whereby forward voltage (built-in voltage of pn junction surfaces) of the parasitic diodes of the MOSFETs of the main MOS regions may be increased. As a result, for example, in an instance in which the MOSFETs are used as an inverter device, at the time of transition of switching the MOSFETs from ON to OFF, a portion of the transient current that flows through the SBDs of the main SBD regions may be suppressed from flowing through the parasitic diodes of the MOSFETs.

For example, the forward voltage of the parasitic diodes of the MOSFETs of the main MOS regions is set to be about two times that of a configuration free of the lifetime killer regions. As a result, in an instance in which the MOSFETs are used as an inverter device, both the transient current that flows at the time of transition of switching the MOSFETs from ON to OFF and the reflux current that flows when the inverter is caused to perform commutation operation may be completely passed through the SBDs of the main SBD regions. As a result, forward characteristics of parasitic diodes of the MOSFETs of the main MOS regions may be prevented from degrading due to the transient current.

Figure 21:
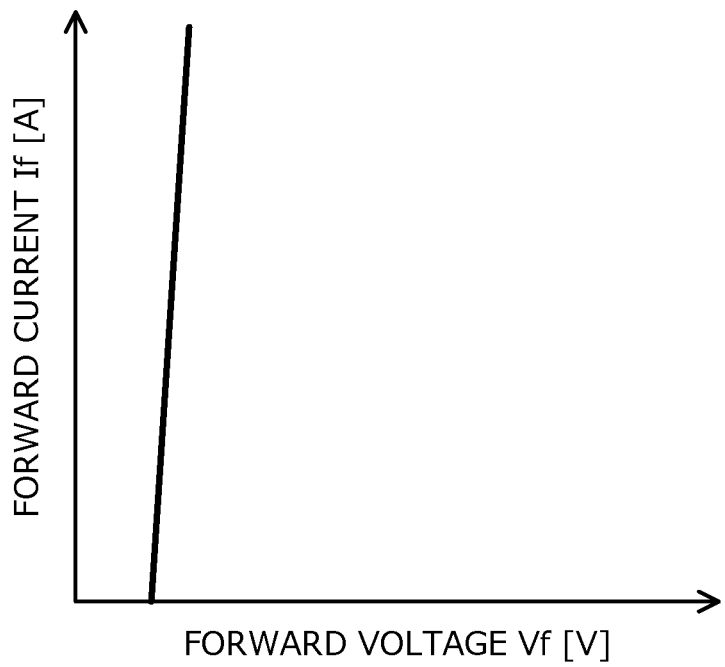
FIG. 21 is a characteristics diagram depicting forward characteristics of SBDs of a first example.
Figure 22:
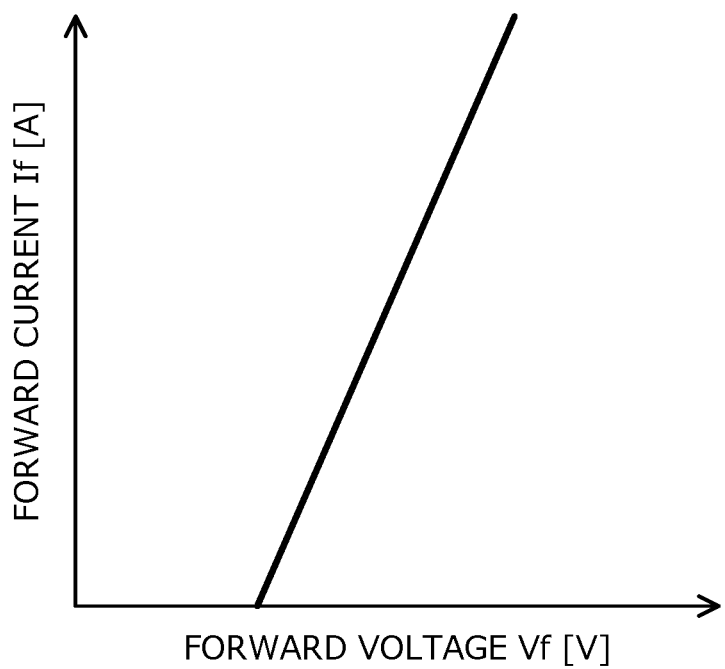
FIG. 22 is a characteristics diagram depicting forward characteristics of parasitic diodes of the first example.

Forward characteristics of the parasitic diodes of the MOSFETs of the main MOS regions 15a and forward characteristics of the SBDs of the main SBD regions 16a were verified. FIGS. 21 and 22 are characteristics diagrams respectively depicting forward characteristics of SBDs and parasitic diodes of a first example. In the semiconductor device 20 described above according to the first embodiment, positive voltage is applied to the source electrode (the source pad 21a) of the main semiconductor device element 11 (hereinafter, the first example, refer to FIG. 4) and negative voltage is applied to the drain electrode 51, whereby forward voltage is applied to the Schottky junction surfaces of the main SBD regions 16a and the pn junction surfaces of the main MOS regions 15a.

In FIG. 21, the forward characteristics of the SBDs of the main SBD regions 16a (relationship between forward voltage and forward current) of the first example are depicted. In FIG. 22, forward characteristics of the parasitic diodes of the MOSFETs of the main MOS regions 15a of the first example are depicted. From the results depicted in FIGS. 21 and 22, a rate of increase of the forward voltage of the parasitic diodes of the MOSFETs of the main MOS regions 15a was confirmed to be small as compared to a rate of increase of the forward voltage of the SBDs of the main SBD regions 16a. The main MOS regions 15a may be set to have a higher resistance than that of the main SBD regions 16a and configuration may be such that the parasitic diodes of the MOSFETs of the main MOS regions 15a do not easily operate.

Figure 23:
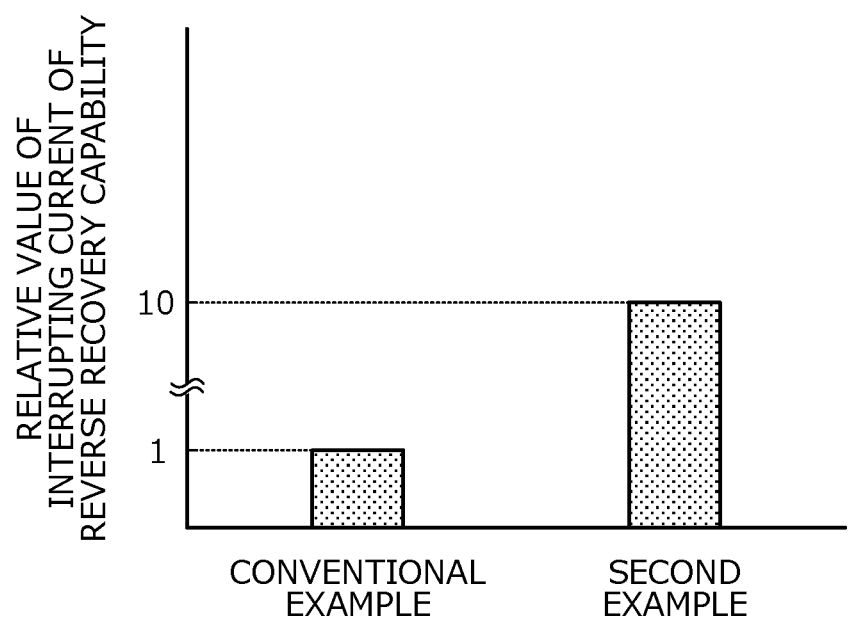
FIG. 23 is a characteristics diagram depicting an amount of interrupting current due to reverse recovery capability of a second example.

Reverse recovery capability of the main semiconductor device element 11 was verified. FIG. 23 is a characteristics diagram depicting the amount of interrupting current due to the reverse recovery capability of a second example. The current amounts of positive hole current (interrupting current) that passes through the p-type base regions 34a, 234 and is pulled out to the source pad 21a, 221 by the main semiconductor device element 11 (hereinafter, the second example, refer to FIG. 4) of the semiconductor device 20 according to the first embodiment and the conventional semiconductor device 220 (hereinafter, conventional example, refer to FIG. 26) free of built-in SBDs, at the time of turn OFF are depicted in FIG. 23.

From the results depicted in FIG. 23, the second example was confirmed to be able to increase the current amount of the positive hole current that passes through the p-type base regions 34a and is pulled out to the source pad 21a at the time of turn OFF, as compared to the conventional example.

Figure 24:
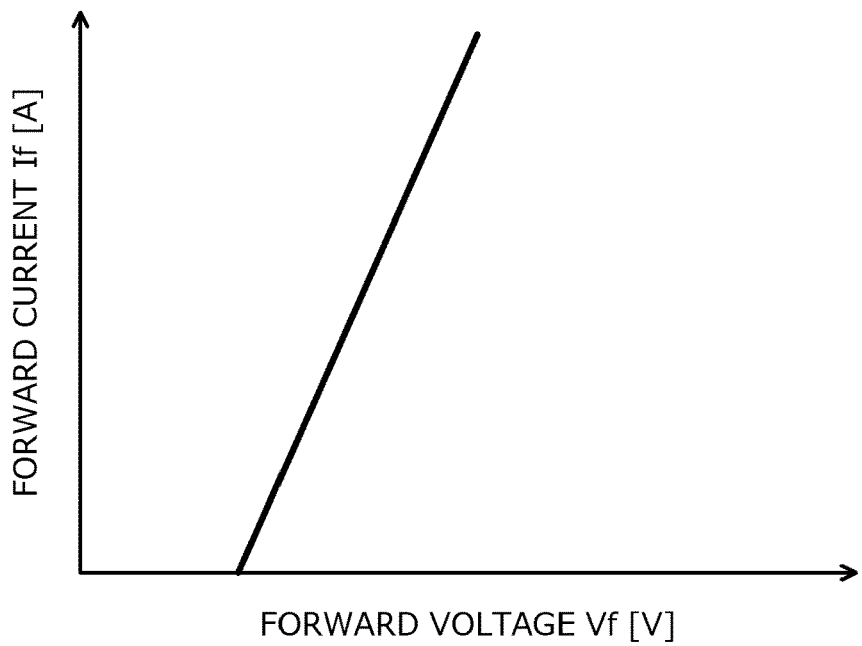
FIG. 24 is a characteristics diagram depicting forward characteristics of parasitic diodes of a third example.
Figure 25:
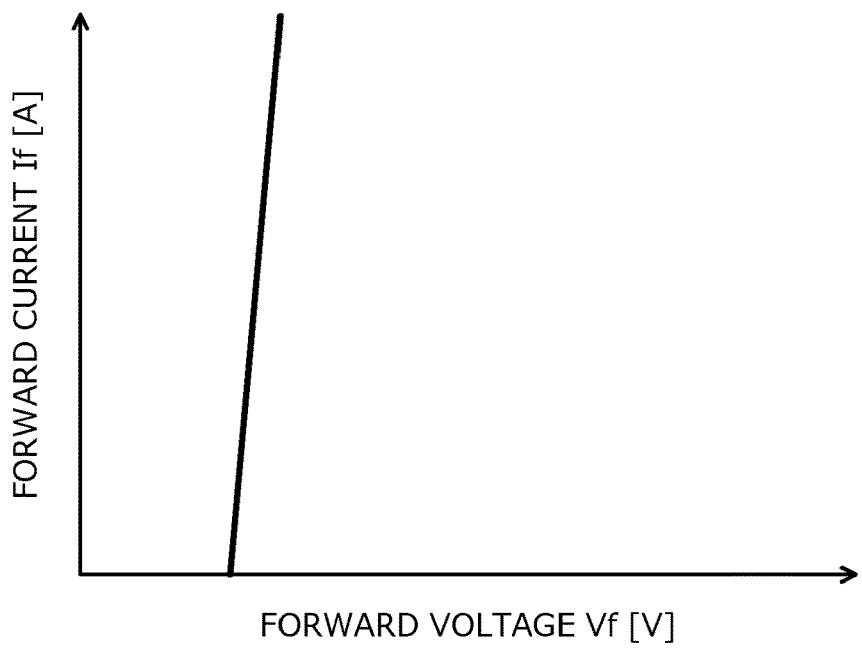
FIG. 25 is a characteristics diagram depicting forward characteristics of parasitic diodes of a comparison example.

For the main semiconductor device element 11 of the semiconductor device 20b according to the third embodiment (refer to FIG. 18), forward characteristics of the parasitic diodes of the MOSFETs of the main MOS regions 15a were verified. FIGS. 24 and 25 are characteristics diagrams respectively depicting forward characteristics of parasitic diodes of a third example and a comparison example. Positive voltage is applied to the source electrode (the source pad 21a) of the main semiconductor device element 11 (hereinafter, the third example) of the semiconductor device 20b described above according to the third embodiment and negative voltage is applied to the drain electrode 51, whereby forward voltage is applied to the pn junction surfaces of the main MOS regions 15a.

FIG. 24 depicts forward characteristics of the parasitic diodes of the MOSFETs of the main MOS regions 15a of the third example. For comparison, FIG. 25 depicts forward characteristics of the parasitic diodes of MOSFETs of the comparison example. The comparison example differs from the third example in that the lifetime killer regions 100 are not provided. In other words, the comparison example corresponds to the first example described above. From the results depicted in FIGS. 24 and 25, it was confirmed that the third example includes the lifetime killer regions 100, whereby the forward voltage of the parasitic diodes of the MOSFETs of the main MOS regions 15a could be increased as compared to the comparison example.

In the foregoing, without limitation to the embodiments of the invention described above, various modifications within a range not departing from the spirit of the invention are possible. For example, the present invention is further applicable in an instance in which instead of silicon carbide, a wide bandgap semiconductor other than silicon carbide is used as a semiconductor material. Further, the present invention is similarly implemented when the conductivity types (n-type, p-type) are reversed.

According to the invention described above, during SBD operation of the second device element regions, electric field applied to the trenches, at the bottom corner portions thereof in the second device element regions, is mitigated and therefore, destruction resistance of the SBDs of the second device element regions may be enhanced.

The semiconductor device of the present invention achieves an effect in that in the semiconductor device having SBDs built into the MOSFETs, destruction by the SBD portions is suppressed.

In this manner, the semiconductor device according to the present invention is useful for power semiconductor devices that control high voltage and large current.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate containing a semiconductor having a bandgap wider than a bandgap of silicon, the semiconductor substrate having a first main surface and a second main surface opposite to each other;
   a first semiconductor region of a first conductivity type, provided in the semiconductor substrate, at the first main surface of the semiconductor substrate;
   a plurality of second semiconductor regions of a second conductivity type, selectively provided between the first main surface of the semiconductor substrate and the first semiconductor region;
   a plurality of third semiconductor regions of the first conductivity type, selectively provided between the first main surface of the semiconductor substrate and the second semiconductor regions, the third semiconductor regions having an impurity concentration higher than an impurity concentration of the first semiconductor region;
   a plurality of trenches penetrating through the third semiconductor regions and the second semiconductor regions, and reaching the first semiconductor region;
   a plurality of gate electrodes that are respectively provided in the trenches via a respective one of a plurality of gate insulating films;
   a plurality of first high-concentration regions of the second conductivity type, selectively provided in the first semiconductor region, the first high-concentration regions, in a depth direction, respectively facing and surrounding bottoms of the trenches, the first high-concentration regions having an impurity concentration higher than an impurity concentration of the second semiconductor regions;
   a plurality of second high-concentration regions of the second conductivity type, selectively provided in the first semiconductor region, separate from the first high-concentration regions and the trenches, and in contact with the second semiconductor regions, bottoms of the second high-concentration regions being located at positions deeper from the second semiconductor regions than are positions of the bottoms of the trenches, the second high-concentration regions having an impurity concentration higher than the impurity concentration of the second semiconductor regions;

a first electrode provided on the first main surface of the semiconductor substrate, in ohmic contact with the third semiconductor regions between a first adjacent two of the trenches that are adjacent to each other;

a first Schottky electrode provided on the first main surface of the semiconductor substrate, between a second adjacent two of the trenches that are adjacent each other, the first Schottky electrode electrically connected to the first electrode and forming a Schottky junction with the first semiconductor region;

a plurality of fourth semiconductor regions of the second conductivity type, respectively provided between each of the second adjacent two of the trenches and the first semiconductor region, each fourth semiconductor region extending in the depth direction along a sidewall of said each of the second adjacent two of the trenches, from the first main surface toward the second main surface of the semiconductor substrate, and contacting a corresponding one of the first high-concentration regions;

a plurality of fifth semiconductor regions of the second conductivity type respectively provided between respective ones of the fourth semiconductor regions and the first semiconductor region, each fifth semiconductor region being in contact with a respective one of the fourth semiconductor regions, the first semiconductor region and the first Schottky electrode; and a second electrode provided on the second main surface of the semiconductor substrate.

2. The semiconductor device according to claim 1, wherein bottoms of the fifth semiconductor regions are located at positions shallower from the first main surface of the semiconductor substrate in the depth direction than are positions of bottoms of the fourth semiconductor regions.

3. The semiconductor device according to claim 1, further comprising
a third high-concentration region of the second conductivity type, selectively provided between the second adjacent two of the trenches, below the first Schottky electrode, the third high-concentration region being provided in the first semiconductor region, separate from the first high-concentration regions and the trenches, a bottom of the third high-concentration region being located at a position deeper than are the positions of the bottoms of the trenches, the third high-concentration region having an impurity concentration higher than the impurity concentration of the second semiconductor regions.

4. The semiconductor device according to claim 1, further comprising
a lifetime killer region provided between the first adjacent two of the trenches including an entire area in which a corresponding one of the second high-concentration regions is provided, the lifetime killer region extending in a direction orthogonal to a direction of the trenches, to reach corresponding ones of the first high-concentration regions that respectively face one of the first adjacent two of the trenches, at a position deeper than are the positions of the bottoms of the trenches.

5. The semiconductor device according to claim 1, wherein the plurality of fourth semiconductor regions and the corresponding one of the first high-concentration regions surround sidewalls of the second adjacent two of the trenches that face each other.

6. The semiconductor device according to claim 1, further comprising
a current sensing portion having a current sensing region that detects current flowing from the second electrode to the first electrode, and a first protective region surrounding the current sensing region, wherein
the current sensing region has:
a plurality of sixth semiconductor regions of the second conductivity type, selectively provided between the first main surface of the semiconductor substrate and the first semiconductor region, in regions different than positions of the second semiconductor regions,
a third electrode provided on the first main surface of the semiconductor substrate and electrically connected to the sixth semiconductor regions, and
a plurality of insulated gate field effect transistors, each of which uses the first semiconductor region as a drift region, a respective one of the sixth semiconductor regions as a base region, the third electrode as a source electrode, and the second electrode as a drain electrode,
a second Schottky electrode forming a Schottky junction with the first semiconductor region, provided on the first main surface of the semiconductor substrate, in the first protective region, wherein
the second Schottky electrode has a closed curve shape surrounding a periphery of the current sensing region and is electrically connected to the third electrode.

7. The semiconductor device according to claim 6, wherein
the current sensing portion further includes a second protective region surrounding a periphery of the first protective region, and
a plurality of seventh semiconductor regions of the second conductivity type, fixed to a potential of the third electrode is provided in the second protective region, between the first main surface of the semiconductor substrate and the first semiconductor region, separate from the second semiconductor regions and the sixth semiconductor regions.

8. The semiconductor device according to claim 1, further comprising a current spreading layer of the first conductivity type, provided between the first adjacent two of the trenches, and between the first semiconductor region and the second semiconductor regions, the current spreading layer having an impurity concentration higher than the impurity concentration of the first semiconductor region.

9. The semiconductor device according to claim 1, wherein the fifth semiconductor regions have an impurity concentration that is lower than an impurity concentration of the fourth semiconductor regions.

* * * * *